US010134832B2

United States Patent
Agata et al.

(10) Patent No.: US 10,134,832 B2
(45) Date of Patent: Nov. 20, 2018

(54) SEMICONDUCTOR DEVICE AND METHOD OF MANUFACTURING THE SAME

(71) Applicant: FUJI ELECTRIC CO., LTD., Kawasaki (JP)

(72) Inventors: Yasunori Agata, Matsumoto (JP); Hidenori Takahashi, Matsumoto (JP); Naoki Mitamura, Aichi (JP); Aki Shimamura, Matsumoto (JP); Daisuke Ozaki, Okaya (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/638,012

(22) Filed: Jun. 29, 2017

(65) Prior Publication Data

US 2017/0301751 A1    Oct. 19, 2017

Related U.S. Application Data

(63) Continuation of application No. PCT/JP2016/067773, filed on Jun. 15, 2016.

(30) Foreign Application Priority Data

Jun. 30, 2015    (JP) .............................. 2015-131227

(51) Int. Cl.
*H01L 21/26* (2006.01)
*H01L 29/04* (2006.01)
(Continued)

(52) U.S. Cl.
CPC ............ *H01L 29/04* (2013.01); *H01L 21/263* (2013.01); *H01L 29/32* (2013.01); *H01L 29/36* (2013.01);
(Continued)

(58) Field of Classification Search
CPC ................................................. H01L 21/02351
(Continued)

(56) References Cited

U.S. PATENT DOCUMENTS 5,672,906 A * 9/1997 Saito ................... H01L 27/0921
257/369
7,507,646 B2   3/2009 Yamazaki et al.
(Continued)

FOREIGN PATENT DOCUMENTS

JP    11-135509    5/1999
JP    2006-352101   12/2006
(Continued)

OTHER PUBLICATIONS

International Search Report dated Aug. 2, 2016 in corresponding International Application No. PCT/JP2016/067773.
(Continued)

*Primary Examiner* — George Fourson, III

(57) ABSTRACT

A semiconductor device includes: a first conductivity type drift region having crystal defects generated by electron-beam irradiation; a first main electrode region of a first conductivity type arranged in the drift region and having an impurity concentration higher than that of the drift region; and a second main electrode region of a second conductivity type arranged in the drift region to be separated from the first main electrode region, wherein the crystal defects contain a first composite defect implemented by a vacancy and oxygen and a second composite defect implemented by carbon and oxygen, and a density of the crystal defects is set so that a peak signal intensity of a level of the first composite defect identified by a deep-level transient spectroscopy measurement is five times or more than a peak signal intensity of a level of the second composite defect.

10 Claims, 18 Drawing Sheets

(51) Int. Cl.
*H01L 29/868* (2006.01)
*H01L 21/263* (2006.01)
*H01L 29/66* (2006.01)
*H01L 29/739* (2006.01)
*H01L 29/32* (2006.01)
*H01L 29/36* (2006.01)
*H01L 21/02* (2006.01)

(52) U.S. Cl.
CPC .... *H01L 29/6609* (2013.01); *H01L 29/66128* (2013.01); *H01L 29/66348* (2013.01); *H01L 29/7397* (2013.01); *H01L 29/868* (2013.01); *H01L 21/02351* (2013.01)

(58) Field of Classification Search
USPC .......................................... 257/565; 438/798
See application file for complete search history.

(56) References Cited

U.S. PATENT DOCUMENTS

| | | | |
|---|---|---|---|
| 7,569,914 B2 | 8/2009 | Yamazaki et al. | |
| 8,698,285 B2 | 4/2014 | Misumi et al. | |
| 8,846,544 B2 | 9/2014 | Misumi et al. | |
| 2004/0256691 A1* | 12/2004 | Nemoto | H01L 29/0619 257/491 |
| 2006/0281263 A1 | 12/2006 | Yamazaki et al. | |
| 2007/0048982 A1* | 3/2007 | Nemoto | H01L 21/26513 438/510 |
| 2008/0023795 A1 | 1/2008 | Yamazaki et al. | |
| 2008/0079119 A1* | 4/2008 | Inoue | H01L 21/263 257/617 |
| 2010/0009551 A1 | 1/2010 | Inoue | |
| 2010/0019342 A1* | 1/2010 | Kawano | H01L 29/0619 257/494 |
| 2011/0073903 A1* | 3/2011 | Yoshikawa | H01L 29/0619 257/139 |
| 2011/0140243 A1* | 6/2011 | Misumi | H01L 21/263 257/617 |
| 2011/0201187 A1* | 8/2011 | Nishiwaki | H01L 29/0834 438/529 |
| 2012/0001199 A1* | 1/2012 | Bauer | H01L 29/7455 257/77 |
| 2014/0048872 A1* | 2/2014 | Hsieh | H01L 29/7827 257/331 |
| 2014/0179116 A1 | 6/2014 | Misumi et al. | |
| 2015/0357437 A1* | 12/2015 | Vellei | H01L 29/66666 438/270 |
| 2016/0247808 A1* | 8/2016 | Horiuchi | H01L 29/78 |
| 2016/0300768 A1* | 10/2016 | Kamada | G01N 27/041 |
| 2016/0315140 A1* | 10/2016 | Iwasaki | H01L 29/32 |
| 2016/0365250 A1* | 12/2016 | Matsui | H01L 21/221 |
| 2017/0077004 A1* | 3/2017 | Onozawa | H01L 22/32 |
| 2017/0271447 A1* | 9/2017 | Tamura | H01L 29/0834 |

FOREIGN PATENT DOCUMENTS

| | | |
|---|---|---|
| JP | 2007-294602 | 11/2007 |
| JP | 2008-91705 | 4/2008 |
| JP | 2008-177296 | 7/2008 |
| JP | 2011-146673 | 7/2011 |
| JP | 2012-69861 | 4/2012 |
| JP | 2012-243888 | 12/2012 |
| JP | 2015-198166 | 11/2015 |

OTHER PUBLICATIONS

International Preliminary Report on Patentability dated Jan. 11, 2018 in corresponding International Patent Application No. PCT/JP2016/067773.

* cited by examiner

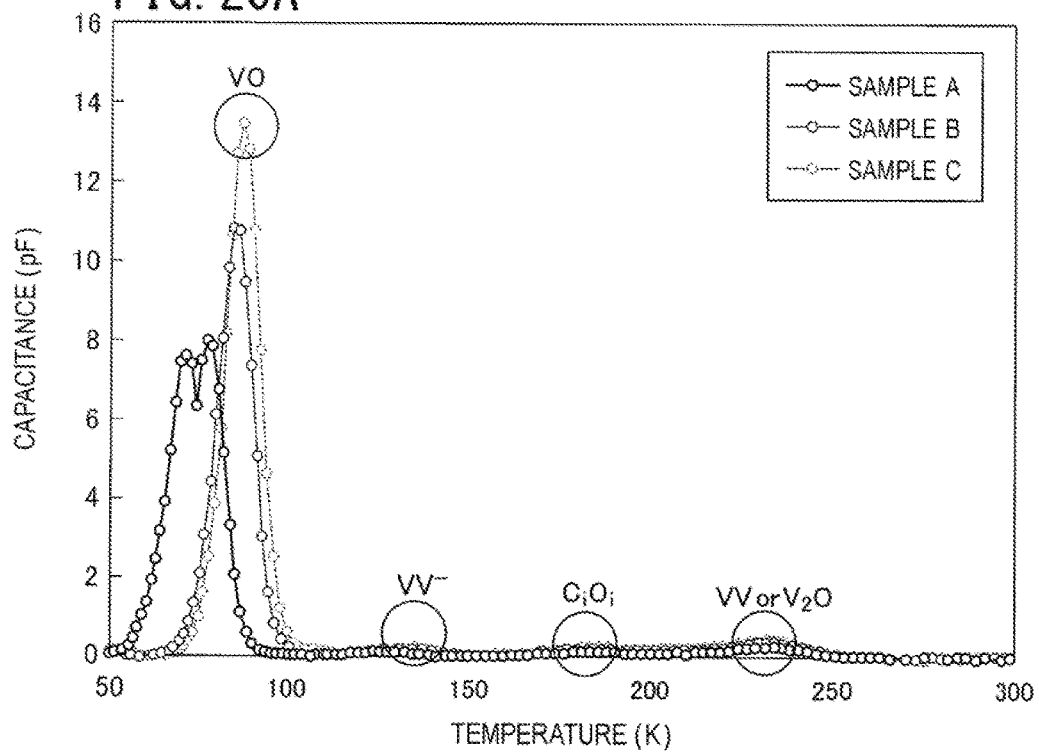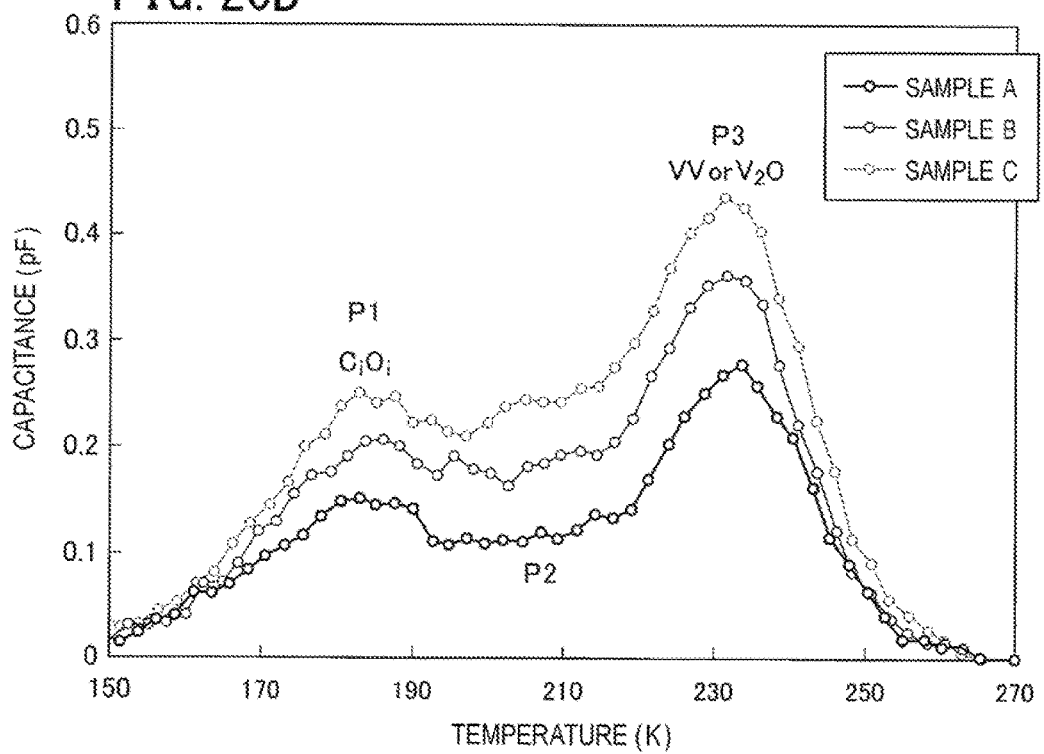

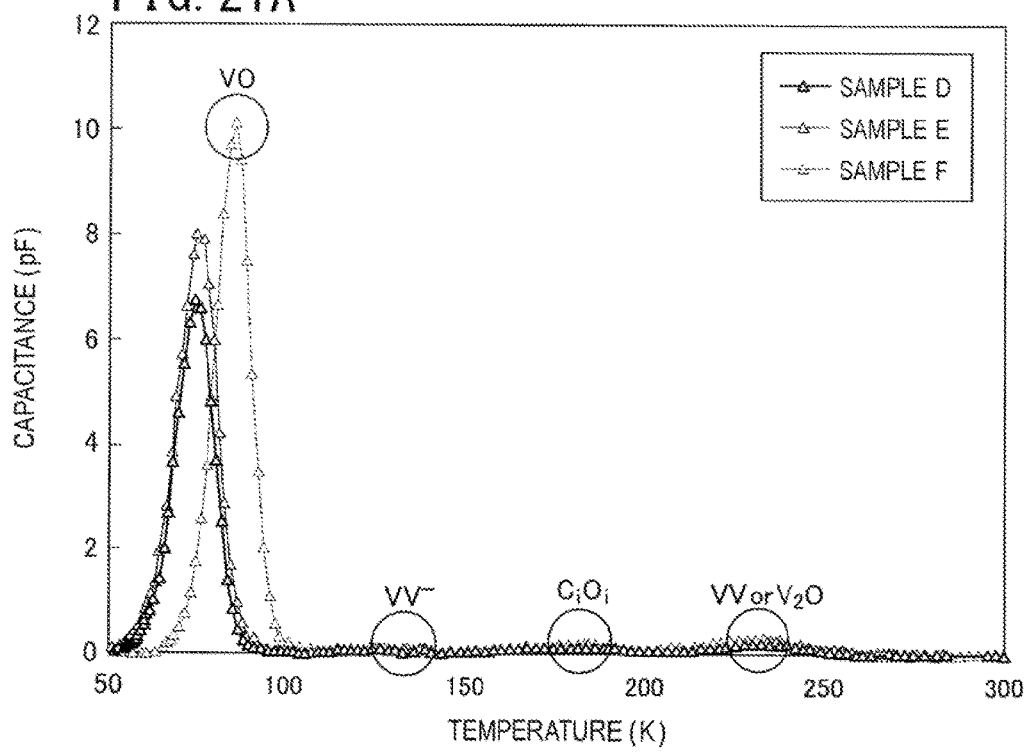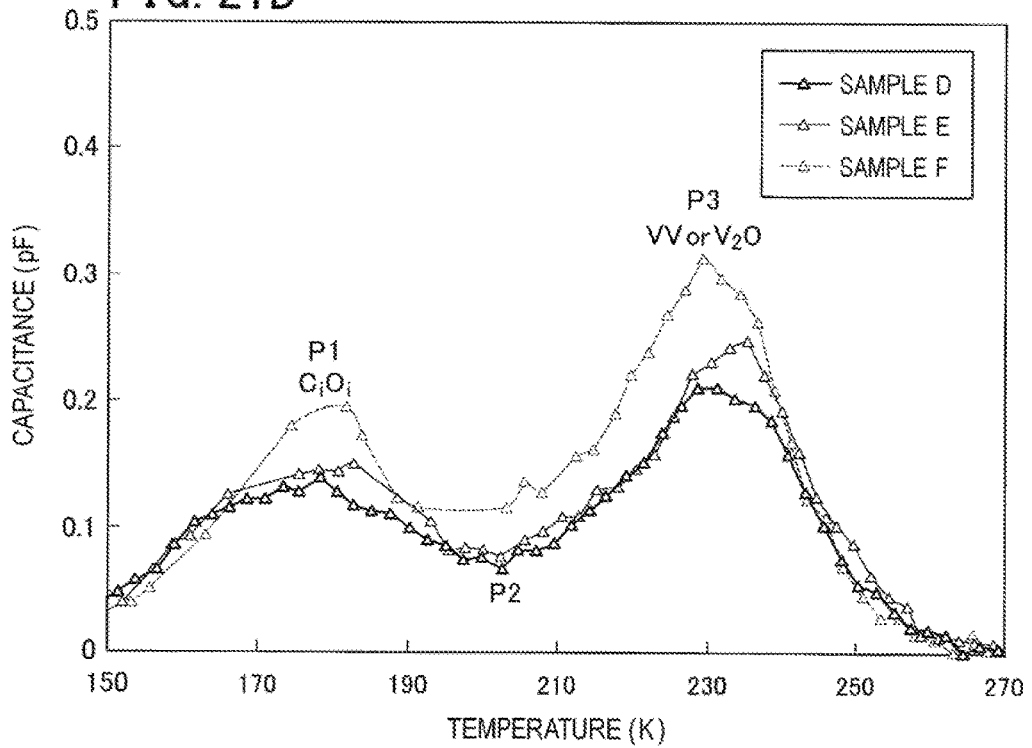

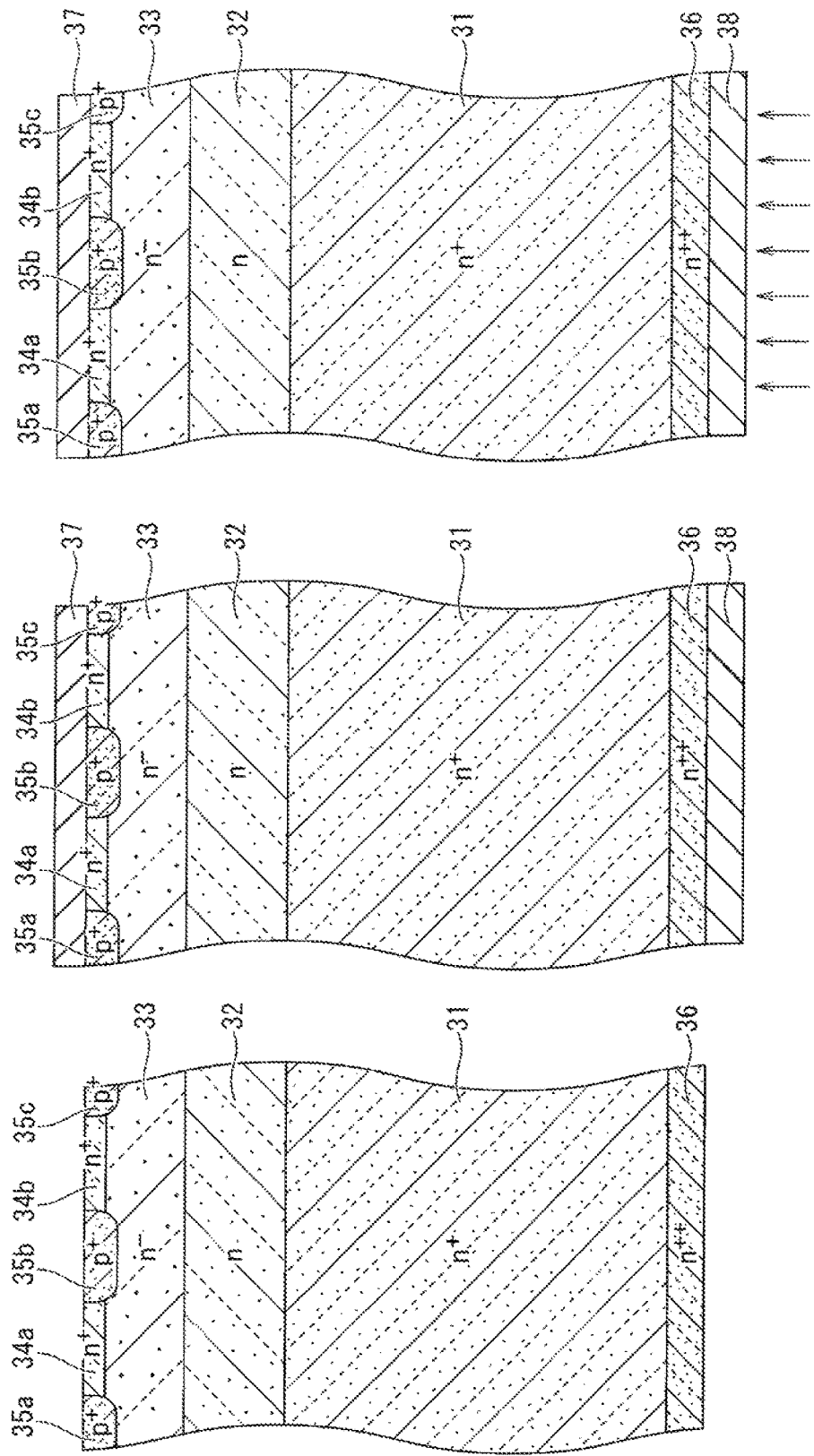

SEMICONDUCTOR DEVICE AND METHOD OF MANUFACTURING THE SAME

CROSS-REFERENCE TO RELATED APPLICATION

This application is a Continuation of PCT Application No. PCT/JP2016/067773, filed on Jun. 15, 2016, and claims the priority of Japanese Patent Application No. 2015-131227, filed on Jun. 30, 2015, the content of both of which is incorporated herein by reference.

BACKGROUND OF THE INVENTION

1. Field of the Invention

The present invention relates to semiconductor devices and methods of manufacturing the semiconductor devices, and more particularly, to semiconductor devices capable of controlling lifetime of carriers and methods of manufacturing the semiconductor devices.

2. Description of the Related Art

In recent years, with the demand for energy saving, the range of applications of power modules used in power conversion apparatuses or the like has expanded. With respect to power devices such as insulated-gate bipolar transistors (IGBTs), metal-oxide-semiconductor field-effect transistors (MOSFETs), or freewheeling diodes (FWD) used in the power modules, in order to improve trade-off between speed and power loss in switching characteristics, it is important to control lifetime of carriers.

As a technique of controlling the lifetime of the carriers, there is a method of intentionally introducing crystal defects in a drift region of a device by electron-beam irradiation. As the defects introduced by the electron-beam irradiation, composite defects are generated due to combination of carbon and oxygen originally contained in a wafer. However, the depth of a defect level is different according to the type of the composite defects, the degree of influence on lifetime of the carriers is also different.

Due to difference of wafer manufacturing methods for every wafer makers, impurity concentrations of carbon, oxygen, and the like contained in the wafers are different among wafer makers. For this reason, the composition ratios of the composite defects generated after the electron-beam irradiation are different according to wafers, and thus, there is a problem that the lifetime of the carriers is different. In addition, even in the case of wafers purchased from the same wafer maker, impurity concentrations are different for each ingot of semiconductor crystals, and impurity concentrations are different according to different portions in even the same ingot, so that the same problem occurs.

In order to remove variations in device characteristics due to such difference in impurity concentration of carbon and the like, a method capable of allowing variations in impurity concentration of carbon originally contained in the wafer to be neglected by introducing a large amount of carbon into the wafer is proposed (refer to JP 2006-352101 A).

However, in a method described in JP 2006-352101 A, since device characteristics are changed by adding a process of introducing a large amount of carbon into a wafer, the method cannot be applied to devices that have already been in mass production, and costs are greatly increased.

In view of the above problems, an object of the present invention is to provide a semiconductor device capable of equalizing composition ratios of various types of composite defects having different levels among the processed wafers after electron-beam irradiation and easily adjusting variations in device characteristics even in a case where impurity concentrations of carbon or oxygen contained in a base material (semiconductor substrate) as a starting material are different and a method of manufacturing the semiconductor device.

SUMMARY OF THE INVENTION

An aspect of the present invention inheres in a semiconductor device including: a first conductivity type drift region having crystal defects generated by electron-beam irradiation; a first main electrode region of a first conductivity type arranged in a portion of the drift region and having an impurity concentration higher than that of the drift region; and a second main electrode region of a second conductivity type arranged in another portion of the drift region to be separated from the first main electrode region, wherein the crystal defects contain a first composite defect implemented by a vacancy and oxygen and a second composite defect implemented by carbon and oxygen, and a density of the crystal defects is set so that a peak signal intensity of a level of the first composite defect identified by a deep-level transient spectroscopy measurement is five times or more than a peak signal intensity of a level of the second composite defect.

Another aspect of the present invention inheres in a method of manufacturing a semiconductor device having a first composite defect implemented by a vacancy and oxygen and a second composite defect implemented by carbon and oxygen, including: forming a first main electrode region of a first conductivity type on a portion of a semiconductor substrate having the first conductivity type, the first main electrode region having an impurity concentration higher than that of the semiconductor substrate; forming a second main electrode region of a second conductivity type on another portion of the semiconductor substrate so as to be separated from the first main electrode region; and generating crystal defects in the semiconductor substrate by irradiating the semiconductor substrate with electron beams, wherein, acceleration energy of the electron beam is set so that a peak signal intensity of a level of the first composite defect identified by a deep-level transient spectroscopy measurement is five times or more than a peak signal intensity of a level of the second composite defect

BRIEF DESCRIPTION OF THE DRAWINGS

FIG. 20A is a characteristic diagram illustrating DLTS spectrums of Samples A to C, and FIG. 20B is a partially enlarged view of FIG. 20A;

FIG. 21A is a characteristic diagram illustrating DLTS spectrums of Samples D to F, and FIG. 21B is a partially enlarged view of FIG. 21A;

FIGS. 26A to 26C are cross-sectional views continuing from FIGS. 25A to 25C sequentially illustrating the method of manufacturing the semiconductor device pertaining to the third embodiment.

DETAILED DESCRIPTION OF THE INVENTION

Figure 1:
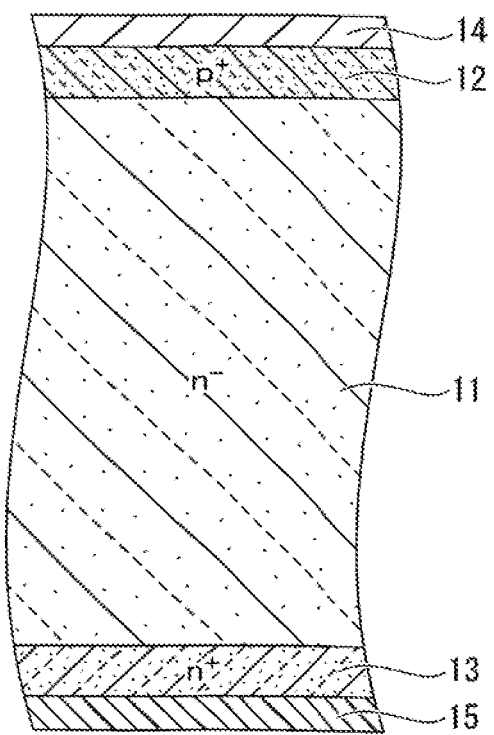
FIG. 1 is a cross-sectional view illustrating a structure of a semiconductor device pertaining to a first embodiment of the present invention.

With reference to the Drawings, first to third embodiments of the present invention will be explained in detail below. In the following description of the Drawings, the same or similar reference numerals are assigned to the same or similar portions. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some Drawings, portions are illustrated with different dimensional relationships and proportions. Moreover, the first to third embodiments shown below exemplifies devices and methods for embodying the technical ideas of the present invention. The technical ideas of the present invention do not specify the materials of the constituent components and the shape, structure, and arrangement thereof to those described below. The technical idea of the present invention can be variously changed without departing from the technical scope prescribed by the claims.

In the Specification, a "first main electrode region" is assigned to a region which serves as any one of emitter and collector regions in the case of IGBTs. Alternatively, the "first main electrode region" is assigned to a region which serves as any one of anode and cathode regions in diode, static induction thyristors (SI-thys) or gate turn-off thyristors (GTO). A "second main electrode region" is assigned to a region which serves as any one of emitter and collector regions that is not the first main electrode region in IGBTs. Alternatively, "second main electrode region" is assigned to a region which serves as any one of anode and cathode regions that is not the first main electrode region in diode, SI-thys and GTOs. In other words, when the first main electrode region is the emitter region, the second main electrode region is the collector region. When the first main electrode region is the anode region, the second main electrode region is the cathode region.

In this Specification, a "first conductivity-type" refers to any one of p-type and n-type, and a "second conductivity-type" refers to the conductivity type opposite to the first conductivity-type. In the semiconductor devices pertaining to the first to third embodiments, which will be described below, the first and second conductivity types are respectively assigned to n-type and p-type, but this is a matter of choice. When the first and second conductivity types are p-type and n-type, respectively, the technical idea and effectiveness of the present invention can be achieved similarly by inverting the polarity in the following description. The present invention does not need to be limited to the choice of the conductivity type used in the following description. In the Specification and accompanying Drawings, the majority carriers are electrons or holes in n and p labeled layers or regions, respectively. Superscripts + and − labeled to n and p mean that semiconductor regions with + or − have higher impurity concentration than that of semiconductor regions without + or −.

In the Specification, definitions of "top" and "bottom" of a top surface, a bottom surface, and the like are just a matter of expression on an illustrated cross-sectional view. For the first to third embodiments of the present invention, when the orientation of the semiconductor device is changed by 90 degrees, the references "top" and "bottom" shall correspond to left and right, and when the orientation of the semiconductor device is changed by 180 degrees, the relationship between the "top" and "bottom" shall be reversed. Meanwhile, definitions of "back surface" is just a matter of expression on an illustrated cross-sectional view. Similar to choice of "top" and "bottom", the references or definition of "back surface" shall be changed when the orientation of the semiconductor device is changed.

(First Embodiment)

<Structure of Semiconductor Device>

As illustrated in FIG. 1, a semiconductor device pertaining to a first embodiment of the present invention is a pin diode, which includes a first conductivity type (n⁻-type) drift region 11, an n-type first main electrode region (cathode region) 13 arranged on a portion (back surface) of the drift region 11, and a second conductivity type (p⁺-type) second main electrode region (anode region) 12 arranged on the other portion (upper surface) of the drift region 11. The cathode region 13 has an impurity concentration higher than that of the drift region 11, and the anode region 12 is separated from the cathode region 13.

The drift region 11, the anode region 12, and the cathode region 13 are implemented by a semiconductor substrate (silicon wafer) as a starting material. The semiconductor substrate is made of a single crystalline silicon (Si) grown by, for example, a floating zone (FZ) method, a Czochralski (CZ) method, a magnetic field application type Czochralski (MCZ) method, or the like. The thickness of a semiconductor substrate implementing the drift region 11, the anode region 12, and the cathode region 13 is, for example, about 50 to 300 micrometers and may be appropriately selected according to the required breakdown voltage or the like.

An anode electrode 14 is arranged on the upper surface of the anode region 12. As the material of the anode electrode 14, for example, aluminum (Al) or an Al alloy such as Al—Si, Al-copper (Cu), or Al—Cu—Si may be used. On the other hand, a cathode electrode 15 is arranged on the back surface of the cathode region 13. As the cathode electrode 15, for example, a single layer metallic film made of gold (Au) or a composite metallic film implemented by laminating Al, nickel (Ni), and Au in this order may be used.

Although impurity elements such as carbon and oxygen are not intentionally doped to the semiconductor substrate implementing the drift region 11, the impurity elements such as carbon or oxygen are contained due to the fabrication method of the semiconductor substrate or the like. The species and the concentration of impurity elements in the semiconductor substrate will vary according to wafers due to difference of wafer makers. Although the impurity concentration of carbon in the semiconductor substrate depends on growth methods, for example, the impurity concentration of carbon of about $1 \times 10^{15}$ atoms/cm³ to $3.5 \times 10^{15}$ atoms/cm³ has been reported, and the impurity concentration of oxygen of about $1 \times 10^{15}$ atoms/cm³ to $3 \times 10^{16}$ atoms/cm³ has been reported. The impurity concentrations of carbon and oxygen in the semiconductor substrate can be measured by secondary ion mass spectrometry (SIMS) or the like. The impurity concentrations of carbon and oxygen in the drift region 11 have, for example, a substantially uniform profile in the depth direction of the semiconductor device.

In the semiconductor device (diode) pertaining to the first embodiment, in the case of switching the voltage from the forward direction to the reverse direction, it takes time to attenuate the carriers accumulated in the drift region 11. In order to control the lifetime of the carriers, crystal defects (composite defects) are formed in the drift region 11 by electron-beam irradiation. The defect density in the drift region 11 has, for example, a substantially uniform profile in the depth direction of the semiconductor device. The crystal defects generated in the drift region 11 may include various composite defects such as "VO defects", "VV defects", "$C_iO_i$ defects", "$V_2O$ defects", and the like. The VO defects are composite defects caused by vacancies and oxygen atoms at lattice points in the crystal, the VV defects are composite defects caused by two vacancies, the $C_iO_i$ defects are composite defects caused by carbon atoms and oxygen atoms at interstitial sites, the $V_2O$ defects are composite defects caused by double vacancies and oxygen atoms.

Among these crystal defects, the VO defects have the shallowest level, and the $C_iO_i$ defects, the VV defects, and the $V_2O$ defects have levels deeper than the VO defect-levels. The categories and densities of the crystal defects in the drift region 11 depend on the species and the concentrations of impurity elements contained in the semiconductor substrate. For example, although the impurities of carbon are not intentionally doped, the probability of occurrence of $C_iO_i$ defects is proportional to the impurity concentration of carbon remaining in the drift region 11, and as the impurity concentration of carbon in the drift region 11 is higher, the $C_iO_i$ defects are easily formed in the drift region 11 in a case where the electron beam is irradiated.

The defect density and level, which depend on the categories of crystal defects in the drift region 11, can be measured by deep-level transient spectroscopy (DLTS) method, or the like. The DLTS method is a method of observing a transient change in capacitance of a depletion layer—phenomenon of carrier emission from the trap—at the time of applying a pulse of bias voltage so as to measure activation energy, capture cross-section, or trap density of traps at deep-levels. On the basis of the fact that the carrier emission time (time constant) is a function of temperature, a peak temperature is obtained by fixing a measuring-time range (time constant). The amount of change in capacitance (hereinafter called "signal intensity") measured by the DLTS method is proportional to the defect density.

Here, in the description of the semiconductor device pertaining to the first embodiment, the defect density is set so that the peak value (hereinafter called "peak signal intensity") of the signal intensity of the VO defect-levels, identified by DLTS measurement, is five times or more than the peak signal intensity of the $C_iO_i$ defect-levels. The inventors of the present invention have found that, by controlling the defect density in this manner, the VO defects are dominantly formed in the drift region 11, and the $C_iO_i$ defects, the VV defects, the $V_2O$ defects, and the like having levels deeper than the VO defect-levels are not easily formed. The defect density of the defects formed in the drift region 11 can be controlled by adjusting the acceleration energy and the like of the electron beam. In addition, the peak signal intensity of the VO defect-levels identified by DLTS measurement is preferably as large as the peak signal intensity of the $C_iO_i$ defect-levels, and for example, the peak signal intensity of the VO defect-levels is preferably ten times or larger.

<Working-Examples>

Next, Working-Examples of the semiconductor device pertaining to the first embodiment will be described together with comparative examples. First, two kinds of first and second base material wafers (hereinafter the semiconductor substrate serving as the base material wafer is called "raw wafer") having different impurity concentrations of carbon and oxygen were prepared as two Working-Examples, and three processed wafers A, B and C pertaining to comparative examples were prepared. The processed wafer A was processed by irradiating the first raw wafer with an electron beam having an acceleration energy of 4.6 MeV and an absorbed dose of 240 kGy, and in the first raw wafer, the impurity concentrations of carbon and oxygen are higher than those of the second raw wafer. Similarly to the processed wafer A, the processed wafer B was processed by irradiating the second raw wafer with electron beams having acceleration energy of 4.6 MeV and an absorbed dose of 240 kGy. The processed wafer C was obtained by not irradiating the second raw wafer with electron beams.

In addition, two kinds of raw wafers having different impurity concentrations of carbon and oxygen were prepared, and processed wafers "a" and "b" pertaining to the Working-Examples were prepared. The processed wafer "a" was processed by irradiating the first raw wafer used for the processed wafer A with electron beams at acceleration energy of 2.0 MeV and absorbed dose of 60 kGy. Similarly to the processed wafer "a", the processed wafer "b" was processed by irradiating the second raw wafer used for the processed wafer B with electron beams at acceleration energy of 2.0 MeV and absorbed dose of 60 kGy. Namely, the acceleration energy of the electron beam for the processed wafers "a" and "b" pertaining to the Working-Examples is set to be lower than that for the processed wafers A and B pertaining to comparative examples. For the processed wafers A, B and C of comparative examples and the processed wafers "a" and "b" of the Working-Examples, the composition ratios of the composite defects were measured by using the DLTS method.

Figure 2:
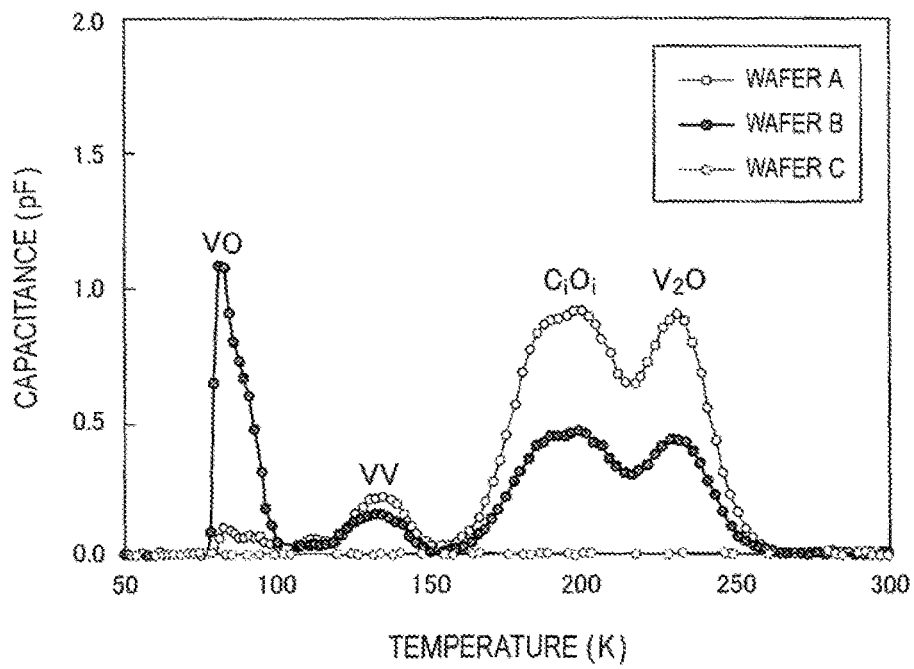
FIG. 2 is a characteristic diagram illustrating a deep-level transient spectroscopy (DLTS) spectrum pertaining to comparative examples.
Figure 3:
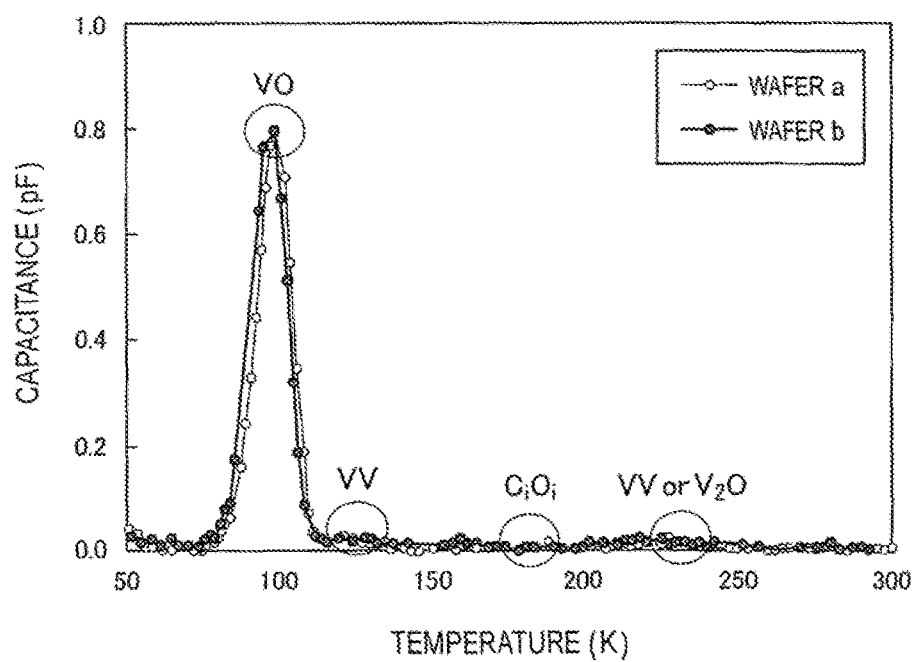
FIG. 3 is a characteristic diagram illustrating a deep-level transient spectroscopy (DLTS) spectrum pertaining to Working-Examples.

FIG. 2 illustrates DLTS spectrums of the processed wafers A, B and C of comparative examples, and FIG. 3 illustrates DLTS spectrums of the processed wafers "a" and "b" of the Working-Examples. The abscissas in FIGS. 2 and 3 denote the absolute temperature. The higher the absolute temperature, the deeper the level of the crystal defects. The ordinates in FIGS. 2 and 3 denote the signal intensity (amount of change in capacitance). The larger the signal intensity, the higher the defect density.

As illustrated in FIG. 2, in the processed wafer C of comparative example, the peak of the signal intensity was not observed, and since the processed wafer C is a raw wafer which was not irradiated with the electron beam, it is understood that so many crystal defects were not generated in the drift region 11. In addition, although not illustrated in FIG. 2, even in a case where the first raw wafer is not irradiated with the electron beam unlike the processed wafer A, the peak of the signal intensity is not observed. In addition, in the processed wafers A and B of comparative examples, in increasing order from the lower temperature side (the side with the shallower level), a plurality of the peaks of the VO defects, the VV defects, the $C_iO_i$ defects, and the $V_2O$ defects are observed. In addition, due to the difference in impurity concentration of carbon, oxygen, or the like between the first and second raw wafers, it is understood that, between the processed wafers A and B, the peak signal intensities of the VO defects, the VV defects, the $C_iO_i$ defects, and the $V_2O$ defects are different from each other, and there are variations in composition ratios of various composite defects.

On the other hand, as illustrated in FIG. 3, it can be understood, in comparison with the processed wafers A and B of comparative examples, in the processed wafers "a" and "b" of the Working-Examples, the $C_iO_i$ defects, the $V_2O$ defects, and the like having levels deeper than that of the VO defect-levels are not easily generated, and thus, the VO defects are dominant. Therefore, even in a case where the impurity concentrations of carbon and oxygen are different between the first and second raw wafers, the composition ratios of various composite defects can be simplified to be equalized between the processed wafers "a" and "b", and thus, variations of the device characteristics can be easily adjusted.

Figure 4:
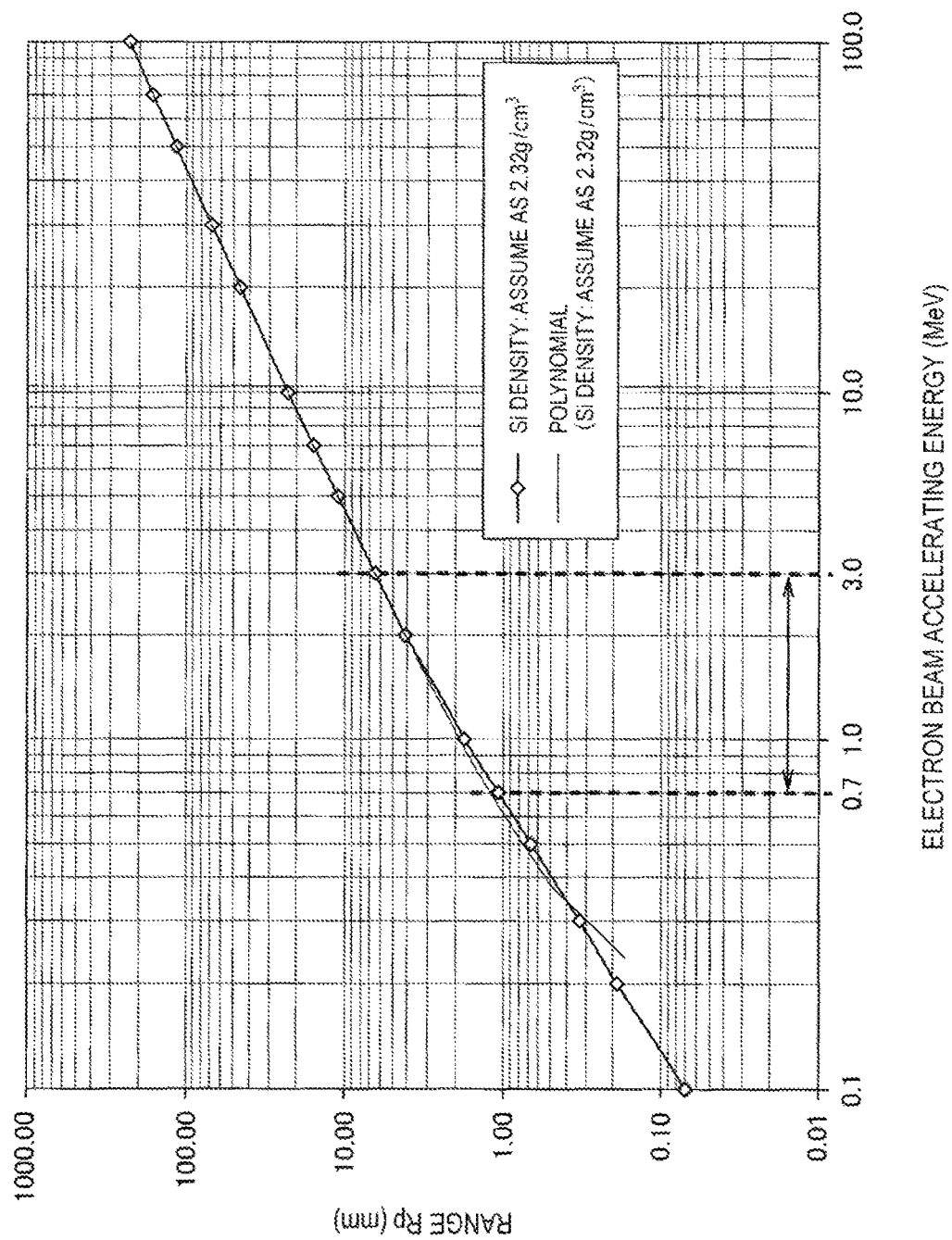
FIG. 4 is a graph illustrating a relationship between acceleration energy of an electron beam and a projected range.

In addition, FIG. 4 illustrates a simulation result of the relationship between the acceleration energy and the projected range of electron beam in the case of irradiating the semiconductor substrate of Si with the electron beams. In FIG. 4, the density of Si is assumed to be 2.32 g/cm$^3$, and fitting to a polynomial equation is performed. The acceleration energy of the electron beam is preferably 700 keV to 3 MeV and, more preferably, 700 keV to 2 MeV.

As described above, in the semiconductor device pertaining to the first embodiment, the density of the crystal defects is set so that the peak signal intensity of the VO defect-levels identified by DLTS measurement is five times or more than the peak signal intensity of $C_iO_i$ defect-levels. Therefore, the VO defects are dominantly formed in the drift region 11, and thus, the composite defects such as the $C_iO_i$ defects having a level deeper than the VO defect-levels are not easily formed. Therefore, even in a case where the impurity concentrations of carbon and the like are different among the raw wafers, with respect to the drift region 11 of the device after the electron-beam irradiation, the composition ratios of various composite defects can be simplified to be equalized in level without depending on the impurity concentrations of carbon and the like, and thus, variations in the device characteristics can be easily adjusted.

<Manufacturing Method of Semiconductor Device>

Next, with reference to FIGS. 5 to 8, a method of manufacturing the semiconductor device (diode) pertaining to the first embodiment will be described. It should be noted that the method of manufacturing the semiconductor device, which will be described below, is merely an example, and the method can be realized by various other manufacturing methods including modifications, as far as the subject matters of the modifications lie in the scope of the claims of the present invention.

Figure 5:
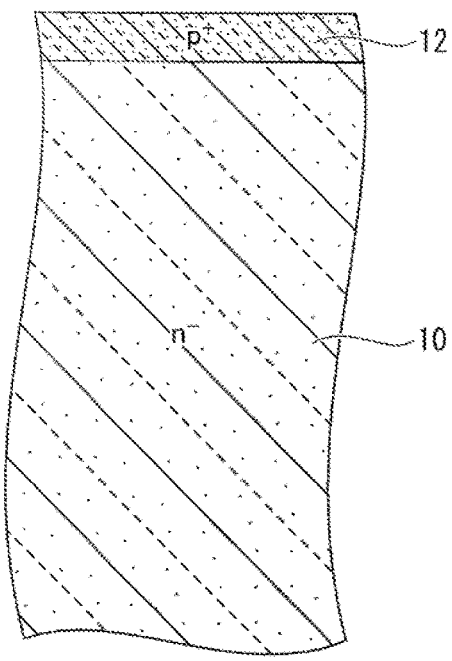
FIG. 5 is a cross-sectional process view illustrating a method of manufacturing the semiconductor device pertaining to the first embodiment.

(A) First, an n$^-$-type raw wafer (semiconductor substrate) 10 made of single crystalline Si is prepared. Although impurity elements such as carbon and oxygen are not intentionally doped to the semiconductor substrate 10, the impurity elements such as carbon and oxygen are contained due to the fabrication method of the semiconductor substrate. Then, p-type impurity ions such as boron (B) are implanted into the surface of the semiconductor substrate 10. After that, as illustrated in FIG. 5, the implanted ions are activated by annealing to form a p$^+$-type anode region 12 having an impurity concentration of, for examples, about $5 \times 10^{17}$ to $1 \times 10^{19}$ cm$^{-3}$.

Figure 6:
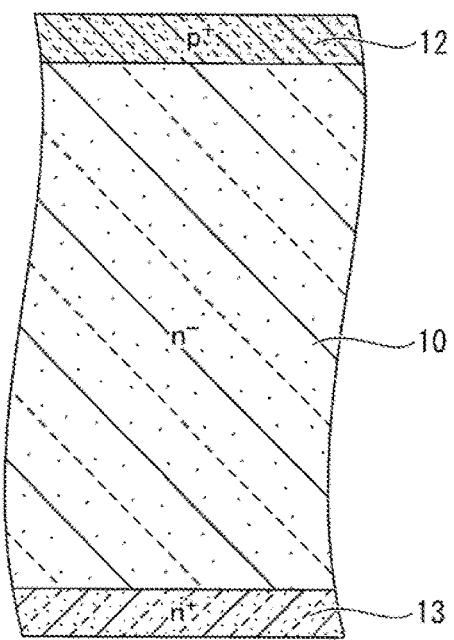
FIG. 6 is a cross-sectional process view continuing from FIG. 5 illustrating the method of manufacturing the semiconductor device pertaining to the first embodiment.

(B) Next, the semiconductor substrate 10 is removed from the back side by grinding, wet etching or the like, and thus, the semiconductor substrate 10 is set to have a desired thickness (for examples, about 50 to 300 micrometers). Then, n-type impurity ions such as arsenic (As) or phosphorus (P) are implanted into the back surface of the semiconductor substrate 10. After that, as illustrated in FIG. 6, the implanted ions are activated by annealing to form an n⁺-type cathode region 13 having an impurity concentration of, for examples, about $1 \times 10^{19}$ cm⁻³ to $1 \times 10^{21}$ cm⁻³. Then, a portion of the semiconductor substrate 10, which is interposed between the anode region 12 and the cathode region 13, is defined as a drift region 11.

Figure 7:
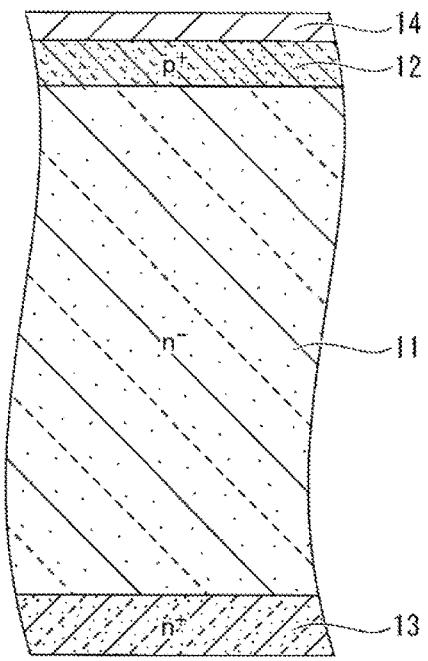
FIG. 7 is a cross-sectional process view continuing from FIG. 6 illustrating the method of manufacturing the semiconductor device pertaining to the first embodiment.

(C) Next, as illustrated in FIG. 7, an anode electrode 14 made of Al or the like is deposited on the upper surface of the anode region 12 by sputtering method, vacuum evaporation method, or the like. Similarly, as illustrated in FIG. 8, a cathode electrode 15 made of Au or the like is deposited on the back surface of the cathode region 13 by sputtering method, vacuum evaporation method, or the like.

Figure 8:
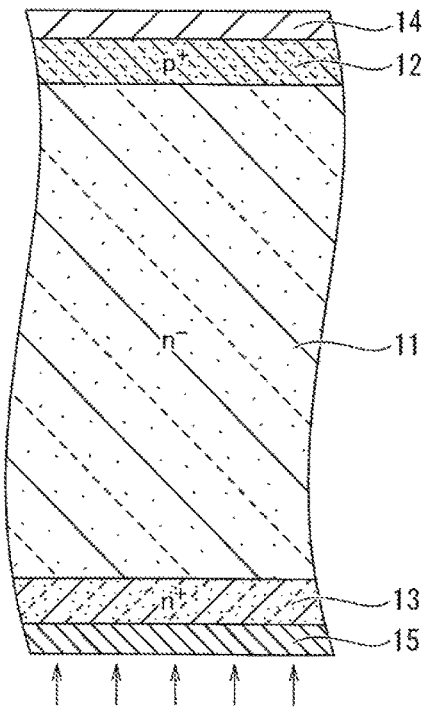
FIG. 8 is a cross-sectional process view continuing from FIG. 7 illustrating the method of manufacturing the semiconductor device pertaining to the first embodiment.

(D) Next, as schematically illustrated by arrows in FIG. 8, by irradiating the semiconductor substrate 10 with electron beams from the back side, crystal defects for controlling lifetime of carriers in the semiconductor substrate 10 is generated. At this time, the absorbed dose of the electron beam is set to about 40 kGy to 60 kGy, and the acceleration energy of the electron beam is set to 3.0 MeV or less (for example, 2.0 MeV). The acceleration energy of the electron beam is preferably 700 keV to 3 MeV, and more preferably 700 keV to 2 MeV. After that, annealing is performed, for example, in hydrogen ambient at 360° C. to 380° C. for 90 minutes to recover crystal defects generated by the electron-beam irradiation, as the crystal defects are unstable in the energy state. By doing so, the semiconductor device pertaining to the first embodiment illustrated in FIG. 1 is achieved.

According to the method of manufacturing a semiconductor device pertaining to the first embodiment, in a case where the crystal defects are generated by electron-beam irradiation, by setting the acceleration energy of the electron beam so that the peak signal intensity of the VO defect-levels identified by DLTS measurement is five times or more than the peak signal intensity of the $C_iO_i$ defect-levels, the VO defects having a shallow level are dominantly formed, and the $C_iO_i$ defects or the like having a level deeper than the VO defect-levels can be not easily formed. Therefore, even in a case where the impurity concentrations of carbon or oxygen are different for each raw wafer (semiconductor substrate), the composition ratios of the defects level and defect density generated in the drift region of the device are simplified to be equalized in level, and thus, variations in device characteristics due to variations in defects levels and defect density can be easily adjusted.

In addition, in the method of manufacturing a semiconductor device pertaining to the first embodiment, as illustrated in FIG. 8, although the case of irradiating with the electron beams from the back side of the semiconductor substrate 10 has been described, the electron beams may be irradiated from the upper side of the semiconductor substrate 10. In addition, although a case such that electron-beam irradiation is performed after the cathode electrode 15 is formed on the back side of the semiconductor substrate 10 has been described, the electron beams may be irradiated from the upper side or the back side of the semiconductor substrate 10 before the cathode electrode 15 is formed—for example, between the process of forming the cathode region 13 and the process of forming the cathode electrode 15. In addition, in some cases, electron beam annealing is not performed on the semiconductor substrate 10 after the electron-beam irradiation.

(Second Embodiment)
<Structure of Semiconductor Device>

Figure 9:
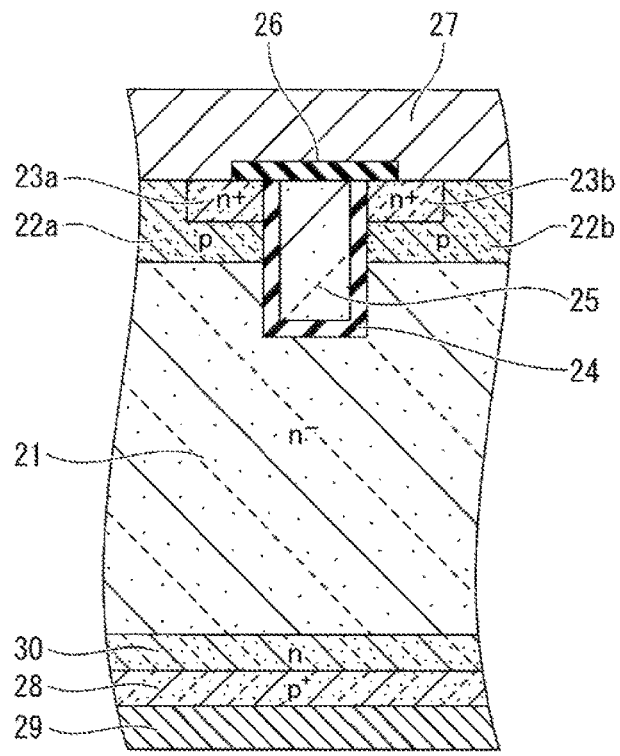
FIG. 9 is a cross-sectional view illustrating a structure of a semiconductor device pertaining to a second embodiment of the present invention.

As a semiconductor device pertaining to a second embodiment of the present invention, an IGBT having a trench gate structure will be described. As illustrated in FIG. 9, the semiconductor device pertaining to the second embodiment includes a first conductivity type (n⁻-type) drift region 21, n⁺-type first main electrode regions (emitter regions) 23a and 23b arranged on a portion (upper side) of the drift region 21, a second conductivity type (p-type) second main electrode region (collector region) 28 arranged on the other portion (back side) of the drift region 21, and a control-electrode structure that controls movement of carriers traveling in the drift region 21. The emitter regions 23a, 23b have an impurity concentration higher than that of the drift region 21, and the collector region 28 is separated from the emitter regions 23a, 23b.

The control-electrode structure includes p-type base regions 22a, 22b and a gate electrode 25. The base regions 22a, 22b are inserted at least between the emitter regions 23a, 23b and the drift region 21. The gate electrode 25 electrostatically controls potentials in the base regions 22a, 22b so as to control the movement of carriers. The control-electrode structure further includes a gate insulating film 24 provided on an inner surface of a recess (trench). As the trench penetrates the base regions 22a, 22b so as to reach an upper portion of the drift region 21, the gate insulating film 24 is interposed between the base regions 22a, 22b and the gate electrode 25.

The gate electrode 25 is buried in the trench through the gate insulating film 24. An emitter electrode 27 is arranged on the gate electrode 25 with an interlayer insulating film 26 interposed between the emitter electrode 27 and the gate electrode 25. The emitter electrode 27 is in contact with the emitter regions 23a, 23b and the base regions 22a, 22b.

An n-type field stop (FS) layer 30 having an impurity concentration higher than that of the drift region 21 is provided between the drift region 21 and the collector region 28. A collector electrode 29 is arranged on the back surface of the collector region 28.

In a state such that the emitter electrode 27 is grounded and a positive voltage is applied to the collector electrode 29, when a positive voltage is applied to the gate electrode 25 with respect to the emitter electrode 27, the semiconductor device (IGBT) pertaining to the second embodiment turns on. When the semiconductor device of the second embodiment is turned on to be led to a conductive state, the conductivity modulation of the base regions 22a, 22b occurs. On the other hand, when a negative voltage is applied to the gate electrode 25 with respect to the emitter electrode 27, the IGBT will be turned off. In a procedure such that the IGBT is being led to a cut-off state, the turn-off process is completed at time when all the holes accumulated in the base regions 22a, 22b disappear.

In the semiconductor device pertaining to the second embodiment, similarly to the first embodiment, in order to control the lifetime of carriers, the drift region 21 contains crystal defects generated by electron-beam irradiation. The crystal defects include the VO defects and the $C_iO_i$ defects having a level deeper than the levels of the VO defects, and the density of the crystal defects is set so that the peak signal intensity of the VO defect-levels identified by DLTS measurement is five times or more than the peak signal intensity of the $C_iO_i$ defect-levels. In addition, the peak signal intensity of the VO defect-levels identified by DLTS measurement is preferably as large as the peak signal intensity of the $C_iO_i$ defect-levels and, for example, the peak signal intensity of the VO defect-levels is preferably ten times or more.

According to the semiconductor device pertaining to the second embodiment, the density of the crystal defects is set so that the peak signal intensity of the VO defect-levels identified by DLTS measurement is five times or more than the peak signal intensity of the $C_iO_i$ defect-levels. Therefore, the VO defects are dominantly formed in the drift region 21, and thus, the composite defects having a level deeper than the VO defect-levels are not easily formed. Therefore, even in a case where the impurity species or impurity concentrations of carbon and the like are different among the raw wafers, the composition ratio of various composite defects can be equalized among the devices, and thus, variations in the device characteristics can be easily adjusted.

<Method of Manufacturing Semiconductor Device>

Next, with reference to FIGS. 10 to 18, an example of a method of manufacturing a semiconductor device (IGBT) pertaining to the second embodiment will be described. It should be noted that the method of manufacturing a semiconductor device described below is merely an example, and the method can be realized by various other manufacturing methods including modifications, as far as the subject matters of the modifications lie in the scope of the claims of the present invention.

Figure 10:
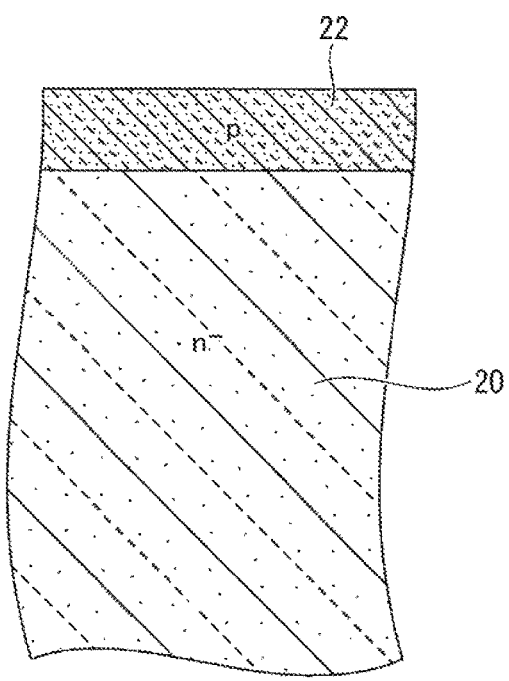
FIG. 10 is a cross-sectional process view illustrating a method of manufacturing the semiconductor device pertaining to the second embodiment.

(A) First, an n⁻-type semiconductor substrate 20 made of single crystalline Si is prepared. Although impurity elements such as carbon and oxygen are not intentionally doped to the semiconductor substrate 20, the impurity elements such as carbon and oxygen are contained due to the fabrication method of the semiconductor substrate. Then, p-type impurity ions such as B are implanted from the upper side of the semiconductor substrate 20 down to a predetermined depth. After that, as illustrated in FIG. 10, the implanted ions are activate by annealing to form a p-type base region 22 having an impurity concentration of, for examples, about $1 \times 10^{17}$ cm⁻³. Alternatively, the base region 22 may be epitaxially grown on the upper surface of the semiconductor substrate 20.

Figure 11:
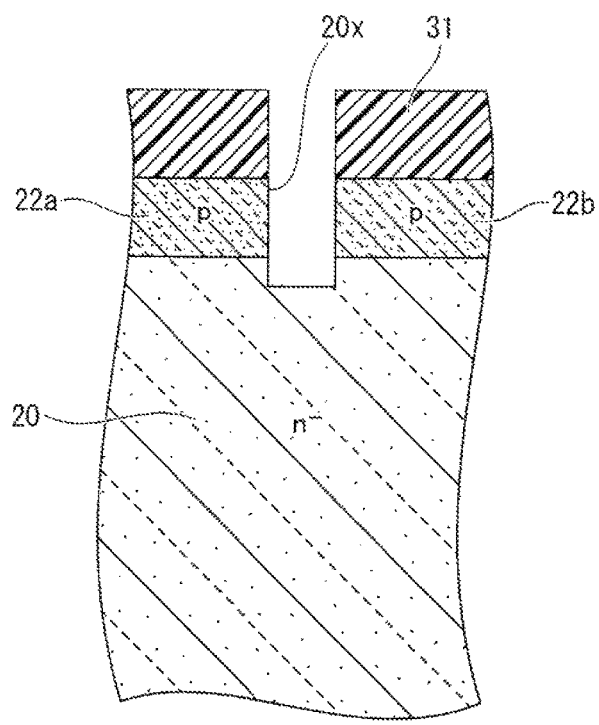
FIG. 11 is a cross-sectional process view continuing from FIG. 10 illustrating the method of manufacturing the semiconductor device pertaining to the second embodiment.

(B) Next, a photoresist film 31 is coated on the semiconductor substrate 20, and the photoresist film 31 is delineated by photolithography. As illustrated in FIG. 11, by dry etching such as reactive ion etching (RIE) or the like in which the delineated photoresist film 31 is used as a trench-etching mask, trenches (recesses) 20x penetrating the base regions 22a, 22b and reaching the upper portion of the semiconductor substrate 20 are selectively dug. After that, the photoresist film 31 is removed by 02 plasma or the like. Alternatively, with another trench-etching mask made of oxide film, the trench 20x reaching the upper portion of the semiconductor substrate 20 may be dug by dry etching or the like. The trench-etching mask made of the oxide film may be formed in a procedure such that, forming an oxide film on the semiconductor substrate 20, coating a photoresist film on the oxide film, delineating the photoresist film by photolithography so as to form an oxide-film etching mask, and thereafter, the oxide film is selectively etched using the oxide-film etching mask so as to establish the trench-etching mask.

Figure 12:
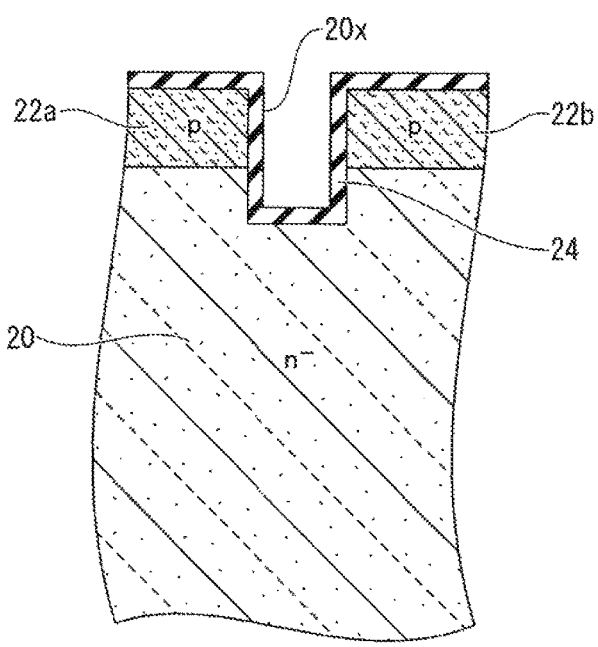
FIG. 12 is a cross-sectional process view continuing from FIG. 11 illustrating the method of manufacturing the semiconductor device pertaining to the second embodiment.
Figure 13:
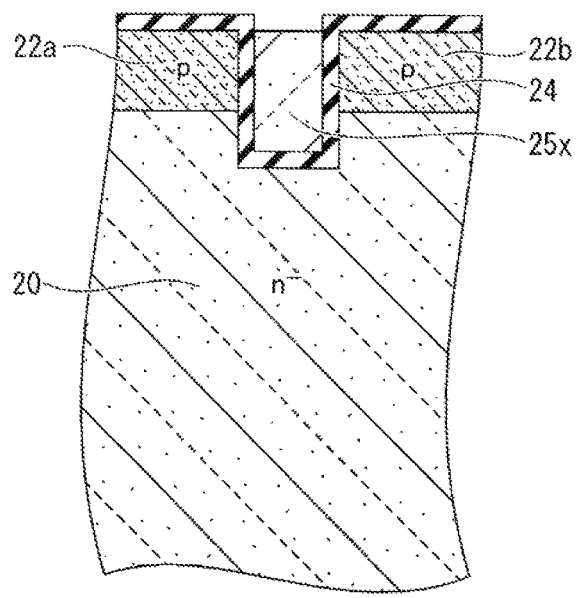
FIG. 13 is a cross-sectional process view continuing from FIG. 12 illustrating the method of manufacturing the semiconductor device pertaining to the second embodiment.
Figure 14:
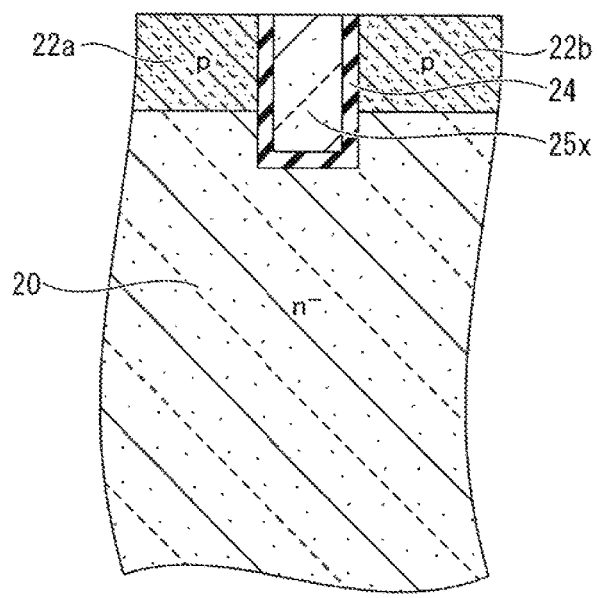
FIG. 14 is a cross-sectional process view continuing from FIG. 13 illustrating the method of manufacturing the semiconductor device pertaining to the second embodiment.

(C) Next, as illustrated in FIG. 12, a gate insulating film 24 made of a silicon oxide film ($SiO_2$ film) is formed on the semiconductor substrate 20 and the inner surface of the trench 20x by thermal oxidation method or the like. Then, a polysilicon film (doped polysilicon film) 25x to which n-type impurities are doped is deposited on the gate insulating film 24 by chemical vapor deposition (CVD) method or the like. After that, as illustrated in FIG. 13, etch back is performed on the polysilicon film 25x, so that the polysilicon film 25x is buried only in the trench 20x through the gate insulating film 24. In addition, as illustrated in FIG. 14, dry etching is performed by using an etching selectivity between the oxide film and polysilicon film, and thus, the gate insulating film 24 is selectively removed so that the upper surfaces of the base regions 22a, 22b are exposed.

Figure 15:
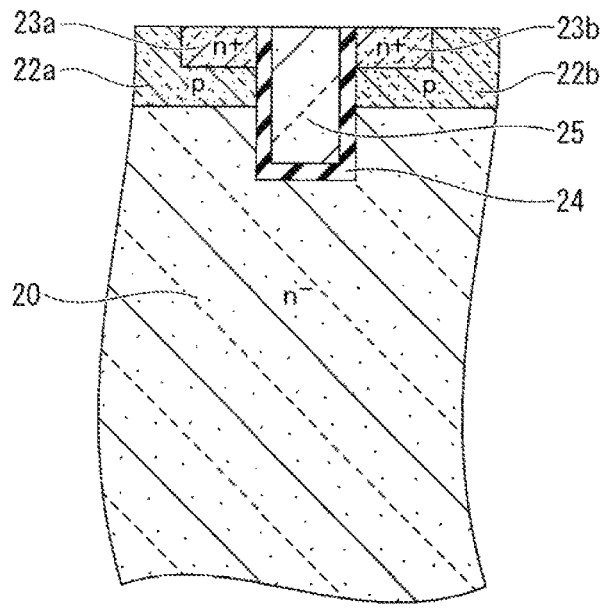
FIG. 15 is a cross-sectional process view continuing from FIG. 14 illustrating the method of manufacturing the semiconductor device pertaining to the second embodiment.
Figure 16:
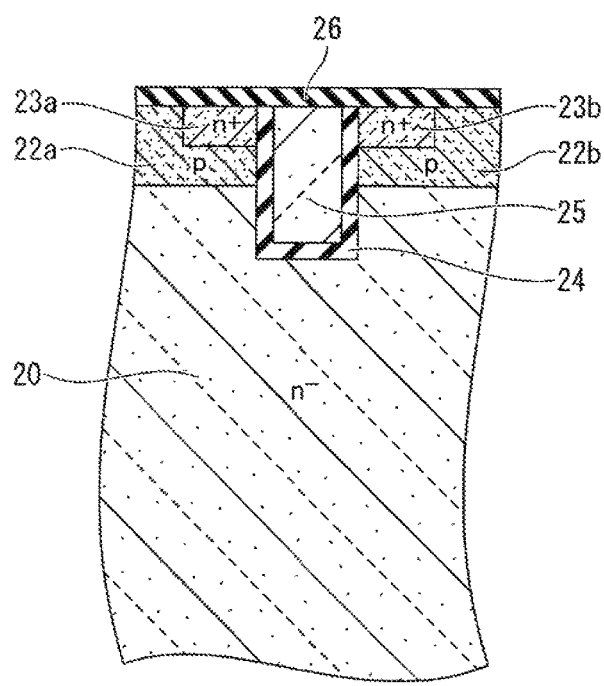
FIG. 16 is a cross-sectional process view continuing from FIG. 15 illustrating the method of manufacturing the semiconductor device pertaining to the second embodiment.

(D) Next, a photoresist film (not illustrated) is coated on the base regions 22a, 22b, and the photoresist film is delineated by photolithography. By using the delineated photoresist film as an implantation mask, n-type impurity ions such as As and P are implanted. At the same time, ions are also implanted into the polysilicon film 25x. Then, the photoresist film is removed by $O_2$ plasma or the like. After that, as illustrated in FIG. 15, the implanted ions are activated by annealing to selectively form an n⁺-type emitter regions 23a, 23b having an impurity concentration of, for examples, about $1 \times 10^{20}$ cm⁻³ in a portion of the upper portions of the base regions 22a, 22b. During the annealing process for the emitter regions 23a, 23b, the ions implanted into the polysilicon film 25x are also activated. In addition, as illustrated in FIG. 16, an interlayer insulating film 26 made of $SiO_2$ film or the like is deposited on the gate electrode 25, the emitter regions 23a, 23b, and the base regions 22a, 22b by CVD method or the like.

Figure 17:
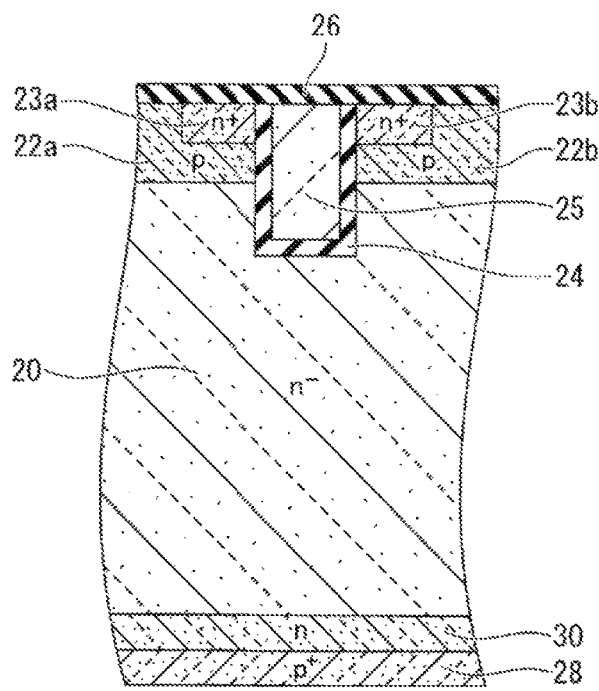
FIG. 17 is a cross-sectional process view continuing from FIG. 16 illustrating the method of manufacturing the semiconductor device pertaining to the second embodiment.

(E) Next, the back side of the semiconductor substrate 20 is removed by grinding, wet etching or the like, and thus, the semiconductor substrate 20 is set to have a desired thickness (for examples, about 50 to 300 micrometers). Then, n-type impurity ions and p-type impurity ions are sequentially implanted from the back side of the semiconductor substrate 20 down to a predetermined depth. After that, as illustrated in FIG. 17, the implanted ions are activated by annealing to form an n-type FS layer 30 and a p-type collector region 28 having an impurity concentration of, for examples, about $1 \times 10^{20}$ cm⁻³. As a result, the region interposed between the base regions 22a, 22b and the collector region 28 of the semiconductor substrate 20 is defined as the drift region 21.

Figure 18:
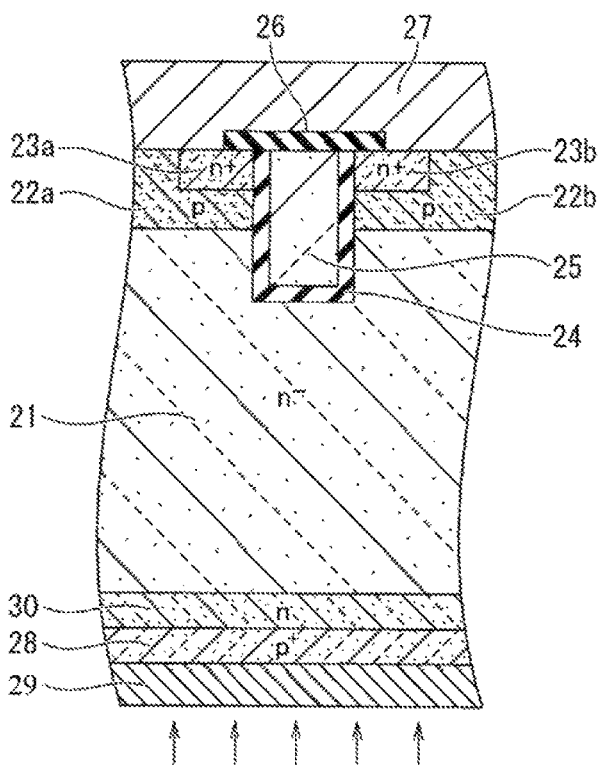
FIG. 18 is a cross-sectional process view continuing from FIG. 17 illustrating of the method of manufacturing the semiconductor device pertaining to the second embodiment.

(F) Next, a photoresist film (not illustrated) is coated on the interlayer insulating film 26, and the photoresist film is delineated by photolithography. Using the delineated photoresist film as a contact-cut mask, the interlayer insulating film 26 is selectively removed by dry etching so as to cut contact-holes in the interlayer insulating film 26. The remaining portion of the interlayer insulating film 26 covers on the gate electrode 25 as illustrated in FIG. 18. After that, the photoresist film is removed by $O_2$ plasma or the like.

(G) Next, as illustrated in FIG. 18, an emitter electrode 27 made of Al or the like is deposited on the upper surfaces of the emitter regions 23a, 23b and the base regions 22a, 22b by sputtering method, vacuum evaporation method or the like. Similarly, a collector electrode 29 made of Au or the like is deposited on the back surface of the collector region 28 by sputtering method, vacuum evaporation method or the like.

(H) Next, as schematically illustrated by arrows in FIG. 18, by irradiating the semiconductor substrate 20 with electron beams from the back side, crystal defects for controlling lifetime of carriers are generated in the semiconductor substrate 20. At this time, the absorbed dose of the electron beam is set to about 40 kGy to 60 kGy, and the acceleration energy is set to 3.0 MeV or less (for example, 2.0 MeV). The acceleration energy of the electron beam is preferably 700 keV to 3 MeV and, more preferably, 700 keV to 2 MeV. After that, annealing is performed, for example, in hydrogen ambient at about 360° C. to 380° C. for about 90 minutes to recover crystal defects generated by the electron-beam irradiation, because the crystal defects are unstable in the energy state. By doing so, the semiconductor device pertaining to the second embodiment illustrated in FIG. 9 is completed.

According to the method of manufacturing a semiconductor device (IGBT) pertaining to the second embodiment, the crystal defects are generated by irradiating the semiconductor substrate 20 with electron beams, and the acceleration energy of the electron beam is set so that the peak signal intensity of the VO defect-levels identified by DLTS measurement is five times or more than the peak signal intensity of the $C_iO_i$ defect-levels. Therefore, the VO defects are dominantly formed in the drift region 21, and the $C_iO_i$ defects or the like having a level deeper than the VO defect-levels are not easily formed. Therefore, even in a case where the impurity concentrations of carbon or the like are different among the raw wafer, the composition ratios of the crystal defects in the processed wafers after the electron-beam irradiation are simplified to be equalized without depending on the impurity concentrations of carbon or the like, and thus, variations in device characteristics can be easily adjusted.

In addition, in the method of manufacturing a semiconductor device pertaining to the second embodiment, as illustrated in FIG. 18, the case of irradiating with the electron beams from the back side of the semiconductor substrate 20 has been described. However, irradiating with electron beams from the upper side of the semiconductor substrate 20 may be performed. In addition, although a case that the electron-beam irradiation is performed after the collector electrode 29 is formed on the back side of the semiconductor substrate 20 has been described, the electron-beam irradiation may be performed from the upper side or the back side of the semiconductor substrate 20 before the collector electrode 29 is formed. For example, the electron-beam irradiation may be performed between the process of forming the emitter electrode 27 and the process of forming the collector electrode 29. In addition, in some cases, electron beam annealing may not be performed on the semiconductor substrate 20 after the electron-beam irradiation.

(Third Embodiment)
<Structure of Semiconductor Device>

Figure 19:
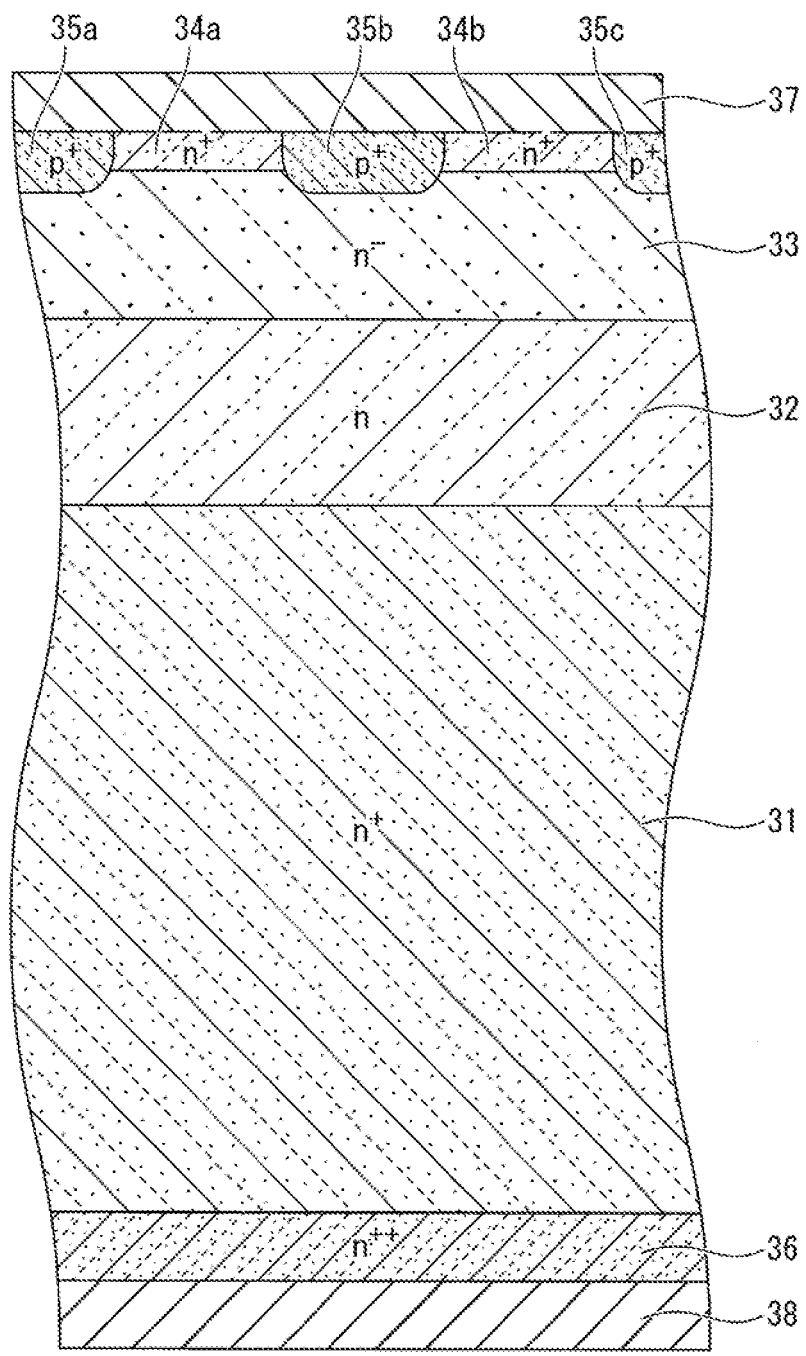
FIG. 19 is a cross-sectional view illustrating a structure of a semiconductor device pertaining to a third embodiment.

As illustrated in FIG. 19, a semiconductor device pertaining to a third embodiment of the present invention is an FWD including a first conductivity type ($n^+$-type) first main electrode region (cathode region) 31, a first conductivity type (n-type) first drift region 32 provided on the cathode region 31, and a first conductivity type ($n^-$-type) second drift region 33 provided on the first drift region 32. The first drift region 32 has an impurity concentration lower than that of the cathode region 31, and the second drift region 33 has an impurity concentration lower than that of the first drift region 32.

The cathode region 31 is implemented by using, as a starting material, a semiconductor substrate (silicon wafer) made of single crystalline Si manufactured by, for example, an FZ method, a CZ method, an MCZ method or the like. The thickness of the semiconductor substrate implementing the cathode region 31 is, for examples, about 50 to 300 micrometers and may be appropriately selected according to the required breakdown voltage or the like.

The first drift region 32 and the second drift region 33 are made of an epitaxial growth layer. During the epitaxial growth of the first drift region 32 and the second drift region 33, impurity elements such as carbon and oxygen are intentionally doped to the first drift region 32 and the second drift region 33. The first drift region 32 and the second drift region 33 may be equal to each other in thickness. The first drift region 32 may be thicker than the second drift region 33, or the first drift region 32 may be thinner than the second drift region 33. The thickness of each of the first drift region 32 and the second drift region 33 is, for examples, about 20 to 100 micrometers.

Second conductivity type ($p^+$-type) second main electrode regions (anode regions) 35a, 35b, 35c are provided in an upper portion of the second drift region 33 so as to be separated from each other. First conductivity type ($n^+$type) $n^+$type regions 34a, 34b having an impurity concentration higher than that of the second drift region 33 are provided between the anode regions 35a, 35b, 35c. The $n^+$type regions 34a, 34b are shallower than the anode regions 35a, 35b, 35c.

An anode electrode 37 is arranged on the upper surfaces of the anode regions 35a, 35b, 35c and the $n^+$-type regions 34a, 34b. As the material of the anode electrode 37, for example, Al or an Al alloy such as Al—Si, Al—Cu, or Al—Cu—Si may be used. A first conductivity type ($n^{++}$-type) cathode contact region 36 having an impurity concentration higher than that of the cathode region 31 is provided on the back surface of the cathode region 31. A cathode electrode 38 is arranged on the back surface of the cathode contact region 36. As the cathode electrode 38, for example, a single layer metallic film made of Au or a composite metallic film of Al, Ni and Au laminated in this order may be used.

In the semiconductor device pertaining to the third embodiment, similarly to the semiconductor devices according to the first and second embodiments, the defect density is set so that the peak signal intensity of the VO defect-levels identified by DLTS measurement is five times or more than the peak signal intensity of the $C_iO_i$ defect-levels. By controlling the defect density in this manner, the VO defects are dominantly formed in the drift first drift region 32 and the second drift region 33, and the $C_iO_i$ defects, the VV defects, the $V_2O$ defects and the like having levels deeper than the VO defect-levels are not easily formed. Therefore, even in a case where the impurity concentrations of carbon or the like are different among the raw wafers, the composition ratios of various composite defects can be simplified for the first drift region 32 and the second drift region 33 of the device by the electron-beam irradiation. After the electron-beam irradiation, because the composition ratios of composite defects are equalized so that the composition ratios do not depend on the impurity concentrations of carbon or the like, variations in device characteristics can be easily adjusted.

Furthermore, by adjusting the doping quantity of impurity elements such as oxygen or carbon to be doped during the epitaxial growth of the first drift region 32 and the second drift region 33, the ratio (P1/P2) of the peak signal intensity P1 of the $C_iO_i$ defect-levels to the intensity P2 is set to be in a range of 1.0 to 1.5. Here, the intensity P2 is a peak intensity at a valley between the signal peak of the $C_iO_i$ defect-levels and the signal peak of the VV or $V_2O$ defect-levels, which are identified by DLTS measurement. In addition, the ratio (P3/P2) of the peak signal intensity P3 of the VV or $V_2O$ defect-levels to the intensity P2 is set to be in a range of 2.0 to 2.5. As a result, the reverse recovery characteristic of FWD can have low surge so as to facilitate the soft recovery.

Alternatively, by adjusting the doping quantity of impurity elements such as oxygen or carbon to be doped during the epitaxial growth of the first drift region 32 and the second drift region 33, the ratio (P1/P2) of the peak signal intensity P1 of the $C_iO_i$ defect-levels to the intensity P2 at the valley portion in the curve between the signal peak of the $C_iO_i$ defect-levels and the signal peak of the VV or $V_2O$ defect-levels identified by DLTS measurement may be set to be in a range of 1.6 to 2.0. In addition, the ratio (P3/P2) of the peak signal intensity P3 of the VV or $V_2O$ defect-levels to the intensity P2 at the valley portion in the curve between the signal peak of the $C_iO_i$ defect-levels and the signal peak of the VV or $V_2O$ defect-levels may be set in a range of 2.6 to 3.0. As a result, the reverse recovery characteristics of the FWD can be allowed to have low loss by hard recovery.

In the FWD using an epitaxial wafer in the earlier technology, in order to suppress the reverse recovery surge voltage $V_{akp}$ and the reverse recovery loss $E_{rr}$, parameters such as thickness or resistivity of the epitaxial growth layer have been adjusted. Alternatively, by adjusting the irradiation amount of electron beams, the annealing temperature and the time after the irradiation, the target value of the forward voltage VF was adjusted. However, if the thickness or resistivity of the epitaxial growth layer is changed, in addition to the reverse recovery characteristics, static characteristics, especially, a breakdown voltage $V_R$ are affected, and thus, a potential distribution inside the device is changed, so that reliability immunity is deteriorated. In addition, in the method of adjusting a surge voltage within a trade-off curve by changing a condition of lifetime control (electron-beam irradiation), in some cases, the target value of the forward voltage VF of a chip and loss is changed, so that performance requirements of the commercial products cannot be satisfied.

On the other hand, according to the semiconductor device pertaining to the third embodiment, by adjusting the doping quantity of the impurity elements during the epitaxial growth of the first drift region 32 and the second drift region 33, without changing the product specifications such as specific resistivity and thickness of the first drift region 32 and the second drift region 33 which are epitaxial growth layers even though the thicknesses of the first drift region 32 and the second drift region 33 are the same, it is possible to adjust the reverse recovery waveform of the FWD to be soft (low surge) or hard (low loss) at the same forward voltage VF.

In addition, in the semiconductor device pertaining to the third embodiment, the structure where the double layers of epitaxial growth layers of the first drift region 32 and the second drift region 33 are laminated on the cathode region 31 is exemplified. However, the epitaxial growth layer on the cathode region 31 may be a single layer or may be a multilayer of triple or more layers.

<Working-Examples>

With two kinds of different raw wafers, by setting the thicknesses of the first drift region 32 and the thickness of the second drift region 33 to be the same value, Samples A to C and Samples D to F, which have the structure of the semiconductor device pertaining to the third embodiment illustrated in FIG. 19, were prepared. Although Samples A to C and Samples D to F were prepared in the same manner, in Samples A to C, during the epitaxial growth of the first drift region 32 and the second drift region 33, in the carbon concentration and the oxygen concentration of Samples A to C are set to be lower than those of Samples D to F. Samples A to C were irradiated with electron beams while changing the absorbed dose to 60 kGy, 80 kGy and 100 kGy, and the subsequent annealing temperature was commonly set to 360° C., and the annealing time was commonly set to one hour. On the other hand, Samples D to F were irradiated with electron beams while changing the absorbed dose to 80 kGy, 100 kGy and 120 kGy, and the subsequent annealing temperature was commonly set to 360° C., and the annealing time was commonly set to one hour. With respect to the manufactured Samples A to F, the composition ratios of the composite defects were measured by using the DLTS method.

FIG. 20A illustrates DLTS spectrums of Samples A to C, and FIG. 20B illustrates a partially enlarged view of FIG. 20A. FIG. 21A illustrates DLTS spectrums of samples D to F, and FIG. 21B illustrates a partially enlarged view of FIG. 21A. From FIGS. 20A and 21A, it can be understood that, in any of Samples A to F, the peak signal intensity of the VO defect-levels is five times or more than the peak signal intensity of the $C_iO_i$ defect-levels.

As illustrated in FIG. 20B, with respect to Samples A to C, it can be understood that the ratio (P1/P2) of the peak signal intensity P1 of the $C_iO_i$ defect-levels to the intensity P2 at the valley portion in the curve between the signal peak of the $C_iO_i$ defect-levels and the signal peak of the VV or $V_2O$ defect-levels is set to be in a range of 1.0 to 1.5. In addition, the ratio (P3/P2) of the peak signal intensity P3 of the VV or $V_2O$ defect-levels to the intensity P2 at the valley portion in the curve between the signal peak of the $C_iO_i$ defect-levels and the signal peak of the VV or $V_2O$ defect-levels is set to be in a range of 2.0 to 2.5.

On the other hand, with respect to Samples D to F, it can be understood from FIG. 21B that the ratio (P1/P2) of the peak signal intensity P1 of the $C_iO_i$ defect-levels to the intensity P2 at the valley portion in the curve between the signal peak of the $C_iO_i$ defect-levels and the signal peak of the VV or $V_2O$ defect-levels is set to be in a range of 1.6 to 2.0. In addition, the ratio (P3/P2) of the peak signal intensity P3 of the VV or $V_2O$ defect-levels to the intensity P2 at the valley portion in the curve between the signal peak of the $C_iO_i$ defect-levels and the signal peak of the VV or $V_2O$ defect-levels is set to be in a range of 2.6 to 3.0.

Figure 22A:
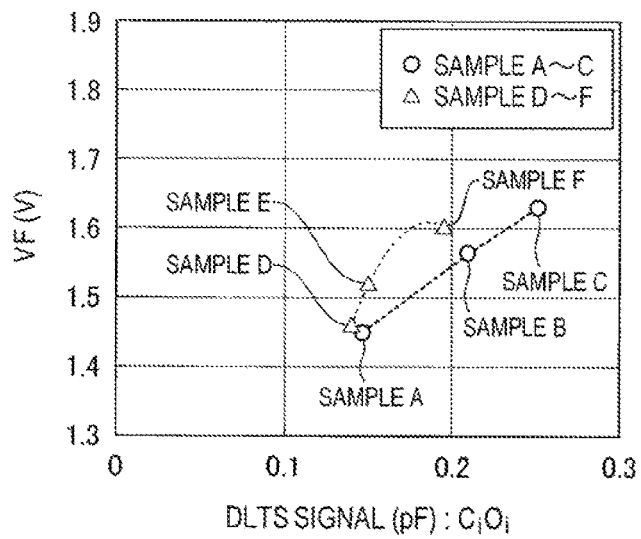
FIG. 22A is a graph illustrating a relationship between a peak signal intensity of a $C_iO_i$ defect-level and a forward voltage with respect to Samples A to F.
Figure 22B:
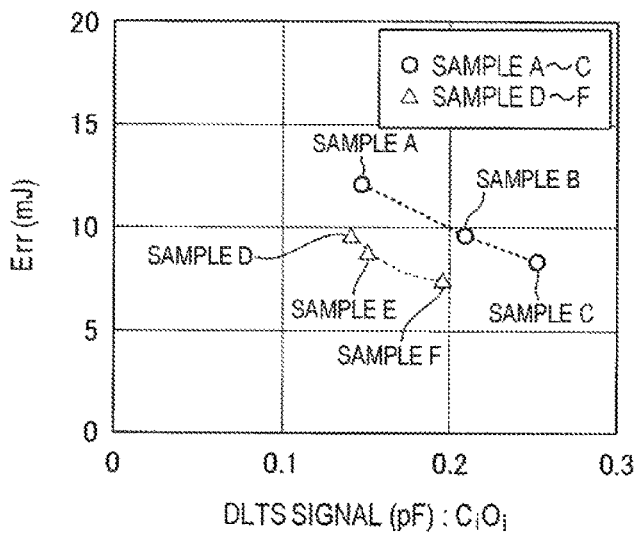
FIG. 22B is a graph illustrating a relationship between the peak signal intensity of the $C_iO_i$ defect-level and reverse recovery loss with respect to Samples A to F.
Figure 22C:
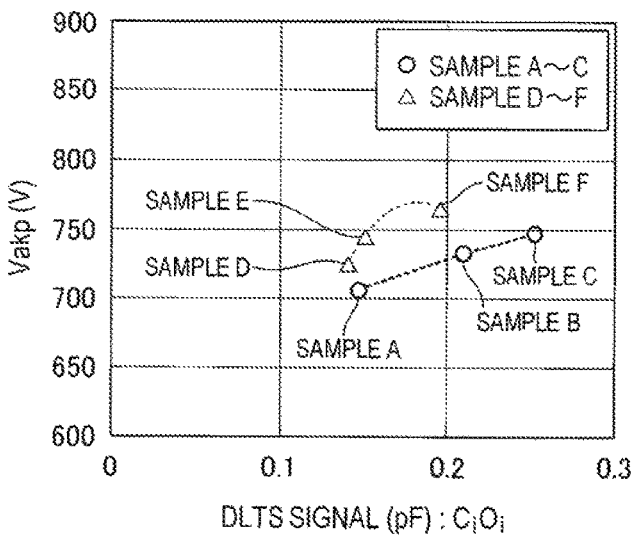
FIG. 22C is a graph illustrating a relationship between a peak signal intensity of the $C_iO_i$ defect-level and a reverse recovery surge voltage with respect to Samples A to F.

FIG. 22A is a graph illustrating a relationship between the peak signal intensity of the $C_iO_i$ defect-levels and forward voltage VF with respect to Samples A to F. FIG. 22B is a graph illustrating a relationship between the peak signal intensity of the $C_iO_i$ defect-levels and reverse recovery loss Err with respect to Samples A to F. FIG. 22C is a graph illustrating a relationship between the peak signal intensity of the $C_iO_i$ defect-levels and a reverse recovery surge voltage $V_{akp}$ with respect to Samples A to F. As illustrated in FIGS. 22A to 22C, similarly to Samples A to C, it is allowed to have linear dependency on the peak signal intensity of the $C_iO_i$ defect-levels, so that low surge can be achieved by soft recovery. On the other hand, similarly to Samples D to F, it is allowed to have nonlinear dependency on the peak signal intensity of the $C_iO_i$ defect-levels, so that low loss can be achieved by hard recovery. The nonlinear dependency of the $C_iO_i$ defect-levels on the peak signal intensity can be established by lowering the carbon concentration and lowering the oxygen concentration during the epitaxial growth of the first drift region 32 and the second drift region 33.

Figure 23A:
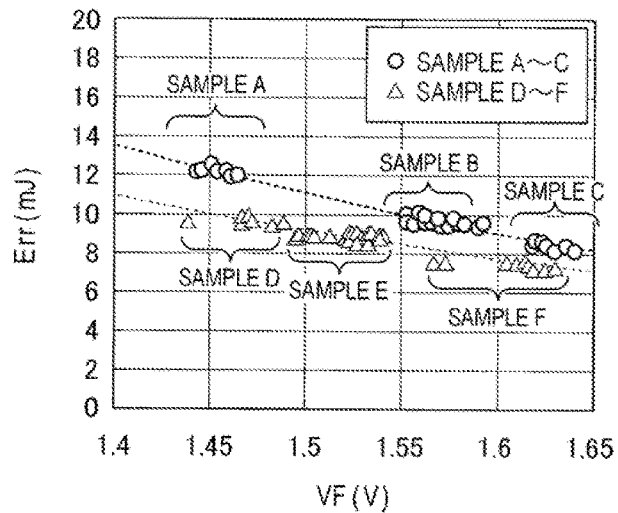
FIG. 23A is a graph illustrating a relationship between a forward voltage and reverse recovery loss with respect to Samples A to F.
Figure 23B:
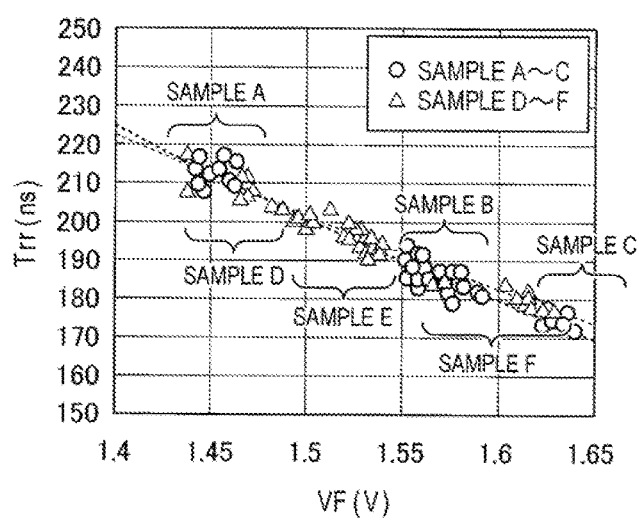
FIG. 23B is a graph illustrating a relationship between a forward voltage and a reverse recovery time with respect to Samples A to F.
Figure 23C:
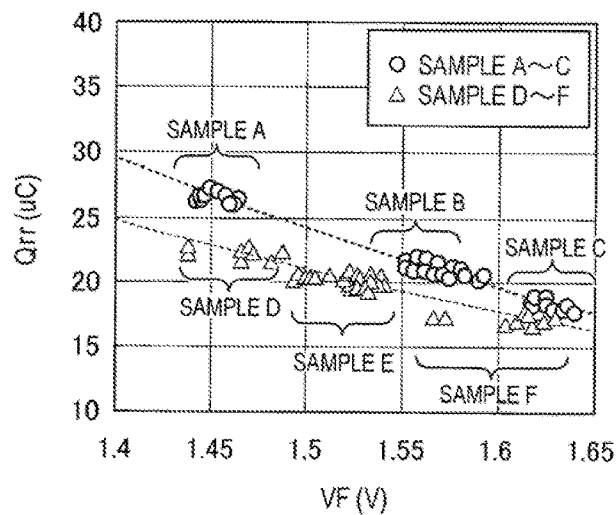
FIG. 23C is a graph illustrating a relationship between a forward voltage and a reverse recovery charge amount with respect to Samples A to F.
Figure 24A:
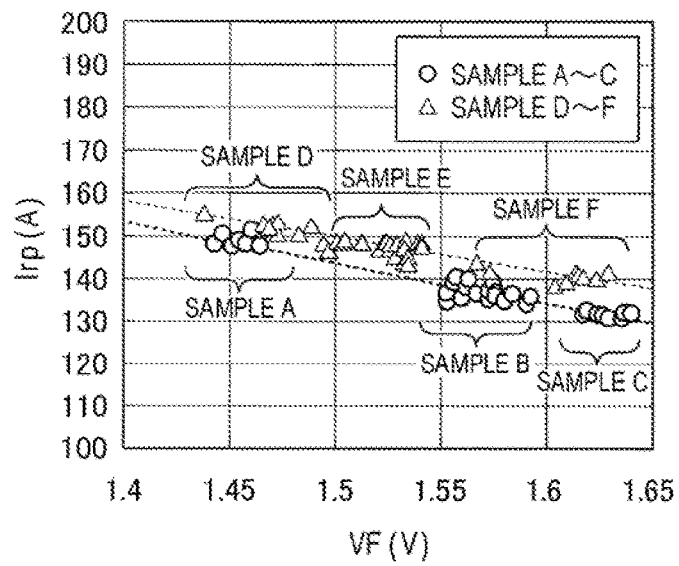
FIG. 24A is a graph illustrating a relationship between a forward voltage and a reverse recovery current with respect to Samples A to F.
Figure 24B:
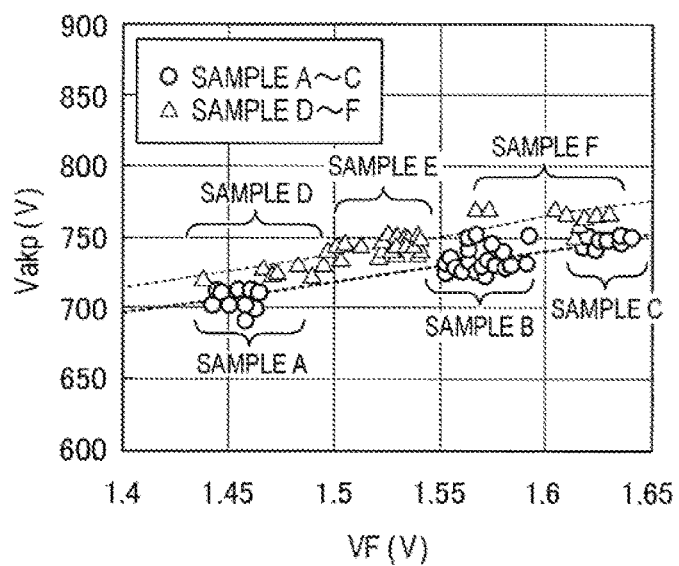
FIG. 24B is a graph illustrating a relationship between a forward voltage and a reverse recovery surge voltage with respect to Samples A to F.

FIG. 23A is a graph illustrating a relationship between forward voltage VF and reverse recovery loss $E_{rr}$ with respect to Samples A to F. FIG. 23B is a graph illustrating a relationship between forward voltage VF and reverse recovery time $T_{rr}$ with respect to Samples A to F. FIG. 23C is a graph illustrating a relationship between forward voltage VF and reverse recovery charge amount $Q_{rr}$ with respect to Samples A to F. FIG. 24A is a graph illustrating a relationship between forward voltage VF and reverse recovery current $I_{rp}$ with respect to Samples A to F. FIG. 24B is a graph illustrating a relationship between forward voltage VF and reverse recovery surge voltage $V_{akp}$ with respect to Samples A to F. It can be understood from FIGS. 23A to 24B that Samples A to C have low surge by soft recovery and Samples D to F have low loss by hard recovery.

<Method of Manufacturing Semiconductor Device>

Next, with reference to FIGS. 25A to 26B, a method of manufacturing a semiconductor device (diode) pertaining to an example of the third embodiment will be described. It should be noted that the method of manufacturing a semiconductor device described below is merely an example, and the method can be established by various other manufacturing methods including modifications, as far as the subject matters of the modifications lie in the scope of the claims of the present invention.

Figure 25A:
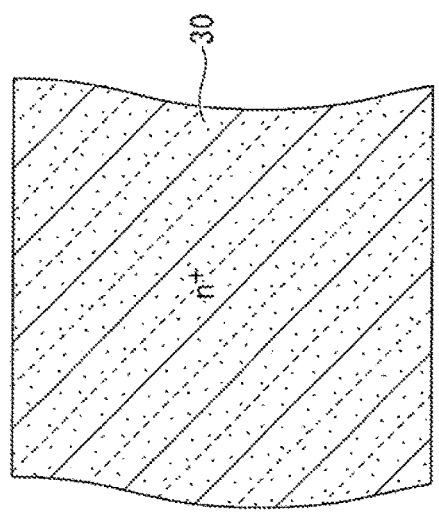
FIGS. 25A to 25C are cross-sectional process views sequentially illustrating a method of manufacturing the semiconductor device pertaining to the third embodiment of the present invention.
Figure 25B:
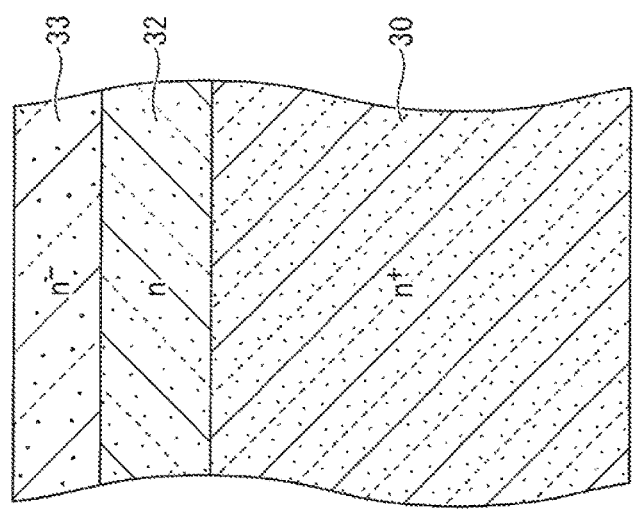

(A) First, as illustrated in FIG. 25A, an n⁺-type raw wafer (semiconductor substrate) 30 made of single crystalline Si is prepared. In addition to n-type impurity elements, impurity elements such as carbon or oxygen are doped in the semiconductor substrate 30 due to a method of manufacturing a semiconductor substrate. An n-type first drift region 32 having a lower impurity concentration than that of the semiconductor substrate 30 is epitaxially grown on the upper surface of the semiconductor substrate 30 while adjusting the doping quantity of impurity elements such as oxygen and carbon. After that, as illustrated in FIG. 25B, an n⁻-type second drift region 33 having an impurity concentration lower than that of first drift region 32 is epitaxially grown on the first drift region 32 while adjusting the doping quantity of the impurity elements such as oxygen and carbon.

Figure 25C:
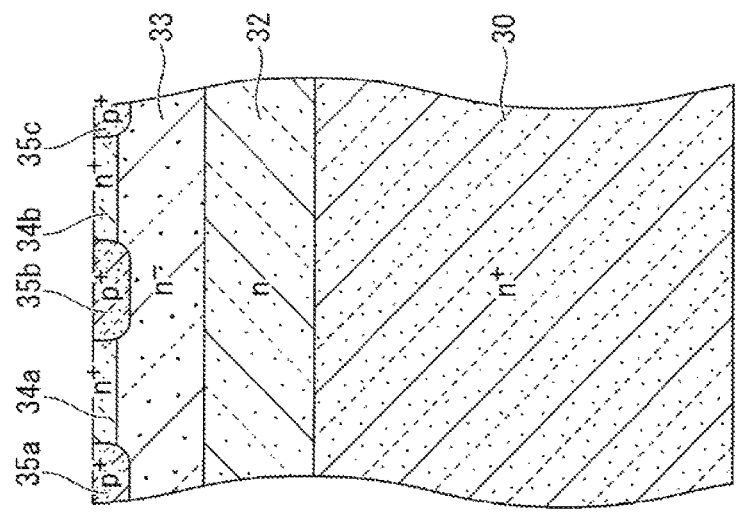

(B) Next, a photoresist film is coated on the surface of the second drift region 33, and the photoresist film is delineated by photolithography. By using the delineated photoresist film as an implantation mask, p-type impurity ions such as B are implanted into the surface of the second drift region 33. After that, the photoresist film is removed, and the implanted ions are activated by annealing to form a p⁺-type anode regions 35a, 35b, 35c having an impurity concentration of, for examples, about $5\times10^{17}$ to $1\times10^{19}$ cm⁻³. In addition, a new photoresist film is coated on the surface of the second drift region 33, and the photoresist film is delineated by photolithography. By using the delineated photoresist film as another implantation mask, n-type impurity ions such as As and P are implanted into the surface of the second drift region 33. After that, the photoresist film is removed, and the implanted ions are activated by annealing to form n⁺-type regions 34a, 34b between the anode regions 35a, 35b, 35c, as illustrated in FIG. 25C.

(C) Next, if necessary, the semiconductor substrate 30 is removed from the back side by grinding, wet etching or the like, and thus, the semiconductor substrate 30 is obtained to have a desired thickness (for examples, about 50 to 300 micrometers). Then, n-type impurity ions such as As and P are implanted into the back surface of the semiconductor substrate 30. After that, as illustrated in FIG. 26A, the implanted ions are activated by annealing to form an n⁺⁺-type cathode contact region 36 having an impurity concentration of, for examples, about $1\times10^{19}$ cm⁻³ to $1\times10^{21}$ cm⁻³, and the semiconductor substrate 30 interposed between the first drift region 32 and the cathode contact region 36 is defined as a cathode region 31.

(D) Next, an anode electrode 37 made of Al or the like is formed on the upper surfaces of the anode regions 35a, 35b, 35c and the n⁺-type regions 34a, 34b by sputtering method, vacuum evaporation method or the like. Similarly, as illustrated in FIG. 26B, a cathode electrode 38 made of Au or the like is formed on the back surface of the cathode contact region 36 by sputtering method, vacuum evaporation method or the like.

(E) Next, as schematically illustrated by arrows in FIG. 26C, by irradiating with electron beams from the back side of the cathode electrode 38, crystal defects for controlling lifetime of carriers are generated in the first drift region 32 and the second drift region 33. At this time, the absorbed dose of the electron beam is set to about 40 kGy to 60 kGy, and the acceleration energy of the electron beam is set to 3.0 MeV or less (for example, 2.0 MeV). After that, annealing is performed, for example, in hydrogen ambient at about 360° C. to 380° C. for about 90 minutes to recover crystal defects, which are unstable in the energy state, generated by irradiation with the electron beams. By doing so, the semiconductor device pertaining to the third embodiment illustrated in FIG. 19 is completed. In addition, the cathode contact region 36 may be formed first and, after that, the anode regions 35a, 35b, 35c may be formed.

According to the method of manufacturing a semiconductor device pertaining to the third embodiment, in a case where the crystal defects are generated by electron-beam irradiation, by setting the acceleration energy of the electron beam so that the peak signal intensity of the VO defect-levels identified by DLTS measurement is five times or more than the peak signal intensity of the $C_iO_i$ defect-levels, the VO defect-levels having a shallow level are dominantly formed, and the $C_iO_i$ defects or the like having a level deeper than the VO defect-levels are not easily formed.

Furthermore, by adjusting the doping quantity of impurity elements such as oxygen or carbon to be doped during the epitaxial growth of the first drift region 32 and the second drift region 33, the ratio (P1/P2) of the peak signal intensity P1 of the $C_iO_i$ defect-levels to the intensity P2 at the valley portion in the curve between the signal peak of the $C_iO_i$ defect-levels and the signal peak of the VV or $V_2O$ defect-levels identified by DLTS measurement is set to 1.0 to 1.5. In addition, the ratio (P3/P2) of the peak signal intensity P3 of the VV or $V_2O$ defect-levels to the intensity P2 at the valley portion in the curve between the signal peak of the $C_iO_i$ defect-levels and the signal peak of the VV or $V_2O$ defect-levels is set to be in a range of 2.0 to 2.5. As a result, the reverse recovery characteristic of FWD can be allowed to have low surge by soft recovery.

Alternatively, by adjusting the doping quantity of impurity elements such as oxygen or carbon to be doped during the epitaxial growth of the first drift region 32 and the second drift region 33, the ratio (P1/P2) of the peak signal intensity P1 of the $C_iO_i$ defect-levels to the intensity P2 at the valley portion in the curve between the signal peak of the $C_iO_i$ defect-levels and the signal peak of the VV or $V_2O$ defect-levels identified by DLTS measurement may be set to be in a range of 1.6 to 2.0. In addition, the ratio (P3/P2) of the peak signal intensity P3 of the VV or $V_2O$ defect-levels to the intensity P2 at the valley portion in the curve between the signal peak of the $C_iO_i$ defect-levels and the signal peak of the VV or $V_2O$ defect-levels may be set to in a range of 2.6 to 3.0. As a result, the reverse recovery characteristics of the FWD can be allowed to have low loss by hard recovery.

(Other Embodiments)

As described above, the present invention has been described using the first to third embodiments, but Description and the Drawings constituting a part of this disclosure should not be interpreted to limit the present invention. It would be obvious to those skilled in the art that various alternative embodiments, Working-Examples, and operational techniques can be made from this disclosure.

For example, in the first to third embodiments, the semiconductor device having a vertical structure has been exemplarily described. However, the first main electrode region and the second main electrode region may be a lateral type device (planar type device) arranged on the same surface of the semiconductor substrate delineating the drift region.

Furthermore, the control-electrode structure of the semiconductor device according to the present invention is not limited to the IGBT having the insulated gate structure exemplified in the second embodiment. For example, the structure of the drift region according to the present invention can be applied to a semiconductor device having a control-electrode structure controlling drift of carriers by a junction gate structure such as SI-thys or GTOs. Therefore, any semiconductor device that can control the lifetime of carriers by electron-beam irradiation can be applied to various semiconductor devices. Furthermore, a semiconductor device having a second gate structure in an inner portion of the drift region in the vicinity of the second main electrode region such as a double gate SI-thyristor may be used.

Furthermore, as described above, in particular, the semiconductor substrate made of single crystalline Si which implements the drift region may be single crystalline Si manufactured by FZ method, CZ method, MCZ method or the like, or may be an epitaxial growth layer formed on a single crystalline Si substrate as a supporting base body.

In addition, the control of the lifetime of the carrier is not limited to electron-beam irradiation, but irradiation with helium or irradiation with protons may be used. In particular, irradiation with helium may be used, and as a result of the irradiation with helium and annealing, the VV defects, the $V_2O$ defects, and the $C_iO_i$ defects may be generated, and these defects may have the predetermined ratios described above.

As described above, it is obvious that the present invention includes various embodiments and the like not described herein. Accordingly, the technical scope of the present invention should be defined by only subject matter of claims appropriate from the above description.

What is claimed is:

1. A semiconductor device comprising:
    a first conductivity type drift region having crystal defects generated by electron-beam irradiation;
    a first main electrode region of a first conductivity type arranged in a portion of the drift region and having an impurity concentration higher than that of the drift region;
    a second main electrode region of a second conductivity type arranged in another portion of the drift region to be separated from the first main electrode region; and
    a control-electrode structure configured to control movement of carriers drifting in the drift region, wherein,
    the crystal defects contain
        a first composite defect implemented by a vacancy and oxygen,
        a second composite defect implemented by carbon and oxygen, and
        a third composite defect implemented by two vacancies or with two vacancies and oxygen,
    a density of the crystal defects is set so that a peak signal intensity of a level of the first composite defect identified by a deep-level transient spectroscopy measurement is five times or more than a peak signal intensity of a level of the second composite defect,
    the peak signal intensity of the level of the second composite defect identified by the deep-level transient spectroscopy measurement is greater than an intensity at a valley of a curve between the peak signal of the level of the second composite defect and a peak signal of a level of the third composite defect, and
    the peak signal intensity of the level of the third composite defect is greater than the intensity at the valley of the curve.

2. The semiconductor device of claim 1, wherein the first main electrode region is arranged on an upper surface of the drift region, and the second main electrode region is arranged on a back surface of the drift region.

3. The semiconductor device of claim 2, wherein the control-electrode structure further includes:
    a gate insulating film provided on an inner surface of a recess penetrating the second conductivity type base region and reaching an upper portion of the drift region so as to be interposed between the second conductivity type base region and the gate electrode,
    wherein the gate electrode electrostatically controls the potential of the second conductivity type base region through the gate insulating film.

4. A semiconductor device comprising:
    a first conductivity type drift region having crystal defects generated by electron-beam irradiation;
    a first main electrode region of a first conductivity type arranged in a portion of the drift region and having an impurity concentration higher than that of the drift region; and
    a second main electrode region of a second conductivity type arranged in another portion of the drift region to be separated from the first main electrode region,
    wherein the crystal defects contain
        a first composite defect implemented by a vacancy and oxygen,
        a second composite defect implemented by carbon and oxygen, and
        a third composite defect implemented by two vacancies or with two vacancies and oxygen,
    a density of the crystal defects is set so that a peak signal intensity of a level of the first composite defect identified by a deep-level transient spectroscopy measurement is five times or more than a peak signal intensity of a level of the second composite defect, and
    at least one of:
        (1) a ratio of the peak signal intensity of the level of the second composite defect identified by the deep-level transient spectroscopy measurement to an intensity at a valley of a curve between the peak signal of the level of the second composite defect and a peak signal of a level of the third composite defect is set in a range of 1.0 to 1.5, and a ratio of the peak signal intensity of the level of the third composite defect to the intensity at the valley of the curve is set in a range of 2.0 to 2.5; or
        (2) the ratio of the peak signal intensity of the level of the second composite defect to the intensity at the valley of the curve is set in a range of 1.6 to 2.0, and the ratio of the peak signal intensity of the level of the third composite defect to the intensity at the valley of the curve is set in a range of 2.6 to 3.0.

5. A method of manufacturing a semiconductor device having a first composite defect implemented by a vacancy and oxygen, a second composite defect implemented by carbon and oxygen, and a third composite defect implemented by two vacancies or with two vacancies and oxygen, comprising:

forming a first main electrode region of a first conductivity type on a portion of a semiconductor substrate having the first conductivity type, the first main electrode region having an impurity concentration higher than that of the semiconductor substrate;

forming a second main electrode region of a second conductivity type on another portion of the semiconductor substrate so as to be separated from the first main electrode region; and generating crystal defects in the semiconductor substrate by irradiating the semiconductor substrate with electron beams, the crystal defects contain the first composite defect, the second composite defect, and the third composite defect, wherein, acceleration energy of the electron beam is set so that a peak signal intensity of a level of the first composite defect identified by a deep-level transient spectroscopy measurement is five times or more than a peak signal intensity of a level of the second composite defect, and at least one of:

(1) a ratio of the peak signal intensity of the level of the second composite defect identified by the deep-level transient spectroscopy measurement to an intensity at a valley of a curve between the peak signal of the level of the second composite defect and a peak signal of a level of the third composite defect is set in a range of 1.0 to 1.5, and a ratio of the peak signal intensity of the level of the third composite defect to the intensity at the valley of the curve is set in a range of 2.0 to 2.5; or (2) the ratio of the peak signal intensity of the level of the second composite defect to the intensity at the valley of the curve is set in a range of 1.6 to 2.0, and the ratio of the peak signal intensity of the level of the third composite defect to the intensity at the valley of the curve is set in a range of 2.6 to 3.0.

6. The method of claim 5, wherein the first main electrode region is formed on an upper surface of the semiconductor substrate, and the second main electrode region is formed on a back surface of the semiconductor substrate.

7. The method of claim 6, further comprising:

forming a second conductivity type base region between the first main electrode region and the semiconductor substrate;

forming a recess penetrating the base region and reaching an upper portion of the semiconductor substrate;

forming a gate insulating film on an inner surface of the recess; and burying a gate electrode in the recess through the gate insulating film, the gate electrode controls a potential in the base region.

8. The method of claim 5, wherein the acceleration energy of the electron beam is 3 MeV or less.

9. The semiconductor device of claim 1, wherein the control-electrode structure includes a second conductivity type base region provided at least between the first main electrode region and the drift region, and a gate electrode electrostatically controlling a potential in the second conductivity type base region to control the movement of the carriers.

10. The semiconductor device of claim 9, wherein the first main electrode region includes a first emitter region and a second emitter region, the first emitter region and the second emitter region being formed on respective sides of the gate electrode and formed in upper portions of the second conductivity type base region.

* * * * *